(12) United States Patent
Dutta et al.

(10) Patent No.: US 12,356,644 B2
(45) Date of Patent: Jul. 8, 2025

(54) GATE TUNNEL CURRENT-TRIGGERED SEMICONDUCTOR CONTROLLED RECTIFIER

(71) Applicant: GlobalFoundries U.S. Inc., Malta, NY (US)

(72) Inventors: Anupam Dutta, Kolkata (IN); Satyasuresh Vvss Choppalli, Bangalore (IN); Rajendran Krishnasamy, Essex Junction, VT (US); Robert J. Gauthier, Jr., Williston, VT (US); Anindya Nath, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 266 days.

(21) Appl. No.: 18/166,041

(22) Filed: Feb. 8, 2023

(65) Prior Publication Data
US 2024/0266422 A1 Aug. 8, 2024

(51) Int. Cl.
*H10D 18/65* (2025.01)
(52) U.S. Cl.
CPC .............................. *H10D 18/655* (2025.01)
(58) Field of Classification Search
CPC ............ H01L 29/7455; H01L 29/0649; H01L 29/404; H01L 29/7436; H01L 29/402; H01L 29/87; H01L 2924/13024; H01L 2924/13034–13035; H01L 27/0262
See application file for complete search history.

(56) References Cited

U.S. PATENT DOCUMENTS

| | | |
|---|---|---|
| 5,541,801 A | 7/1996 | Lee et al. |
| 5,907,462 A | 5/1999 | Chatterjee et al. |
| 6,560,080 B1 | 5/2003 | Chen et al. |

(Continued)

OTHER PUBLICATIONS

Chen et al., "ESD Protection Design With Diode-Triggered Quad-SCR for Separated Power Domains," IEEE Transactions on Device and Materials Reliability, vol. 19, No. 2, Jun. 2019, pp. 283-289.

(Continued)

*Primary Examiner* — Mohammad A Rahman
(74) *Attorney, Agent, or Firm* — Francois Pagette; Hoffman Warnick LLC

(57) ABSTRACT

Disclosed structures include a semiconductor controlled rectifier or bi-directional semiconductor controlled rectifier with a trigger voltage (Vtrig) that is tunable. Some structures include a semiconductor controlled rectifier with an Nwell and Pwell in a semiconductor layer, with a P-type diffusion region in the Nwell, and with an N-type diffusion region in the Pwell. Gate(s) on the well(s) are separated from the junction between the wells and from the diffusion regions. Other structures include a bidirectional semiconductor controlled rectifier with a Pwell between first and second Nwells in a semiconductor layer, with first P-type and N-type diffusion regions in the first Nwell, and with second P-type and N-type diffusion regions in the second Nwell. Gate(s) on the well(s) are separated from junctions between the Nwells and the Pwell and from any diffusion regions. In these structures, the gate(s) can be left floating or biased to tune Vtrig using gate leakage current.

20 Claims, 26 Drawing Sheets

(56) References Cited

U.S. PATENT DOCUMENTS

| | | | |
|---|---|---|---|
| 7,473,973 | B2 | 1/2009 | Kondo |
| 9,245,878 | B2 | 1/2016 | Song et al. |
| 2012/0086079 | A1* | 4/2012 | Kasai ............... H01L 27/14607 257/431 |
| 2018/0096897 | A1* | 4/2018 | Shin .................... H10D 84/038 |
| 2023/0231020 | A1* | 7/2023 | Chuang .............. H01L 29/0649 |

OTHER PUBLICATIONS

Do et al., "A Gate-Grounded NMOS-Based Dual-Directional ESD Protection With High Holding Voltage for 12V Application," IEEE Transactions on Device and Materials Reliability, vol. 20, No. 4, Dec. 2020, pp. 716-722.

Huang et al., "A Gated-Diode ESD SCR—Incorporated BJT for Reversed Floating P+ Junction Modulation," IEEE Transactions on Device and Materials Reliability, vol. 21, No. 1, Mar. 2021, pp. 64-69.

Liang et al., "Design of a gate Diode Triggered SCR for Dual-Direction High-Voltage ESD Protection," IEEE Electron Device Letters, vol. 40, No. 2, Feb. 2019, pp. 163-166.

Lin et al., "Low-Leakage and Low-Trigger-Voltage SCR Device for ESD Protection in 28-nm High-K Metal Gate CMOS Process," IEEE Electron Device Letters, vol. 37, No. 11, Nov. 2016, pp. 1387-1390.

Ma et al., "Comparison of different MOS-triggered SCR structures for on-chip ESD protection," IEEE 3rd International Conference on Computer Research and Development, vol. 3, Mar. 2011, pp. 331-335.

Ng et al., "A Survey of Semiconductor Devices," IEEE Transactions on Electron Devices, vol. 43, No. 10, Oct. 1996, pp. 1760-1766.

Shrivastava et al., "IGBT Plugged in SCR Device for ESD Protection in Advanced CMOS Technology," IEEE 31st EOS/ESD Symposium, Sep. 2009, pp. 1-9.

Song et al., "Inverstigation of high turn-on speed MOS-Triggered SCR in 0.13μm CMOS process," IEEE Asia Pacific Conference on Postgraduate Research in Microelectronics and Electronics (PrimeAsia), Sep. 2010, pp. 210-213.

Song et al., "A Modified LDMOS-SCR with High Holding Voltage for high voltage ESD Protection," The 8th IEEE International Symposium on Next-Generation Electronics, Oct. 2019, pp. 1-3.

Wang et al., "Analysis of High-Failure Mechanism Based on Gate-Controlled Device for Electro-Static Discharge Protection," IEEE Access, Open Access Journal, vol. 8, Nov. 3, 2020, 9 pages.

Wang et al., "A High Failure-Current Gate-Controlled Dual-Direction SCR for High-Voltage ESD Protection in 0.18-μm BCD Technology," IEEE Journal of Emerging and Selected Topics in Power Electronics, vol. 9, No. 1, Feb. 2021, pp. 994-1001.

Wang et al., "Optimized pMOS-Triggered Bidirectional SCR for Low-Voltage ESD Protection Applications," IEEE Transactions on Electron Devices, vol. 61, No. 7, Jul. 2014, pp. 2588-2594.

Zhao et al., "A novel GCSCR structure for ESD protection Application," IEEE International Nanoelectronics Conference (INEC), May 2016, pp. 1-2.

\* cited by examiner

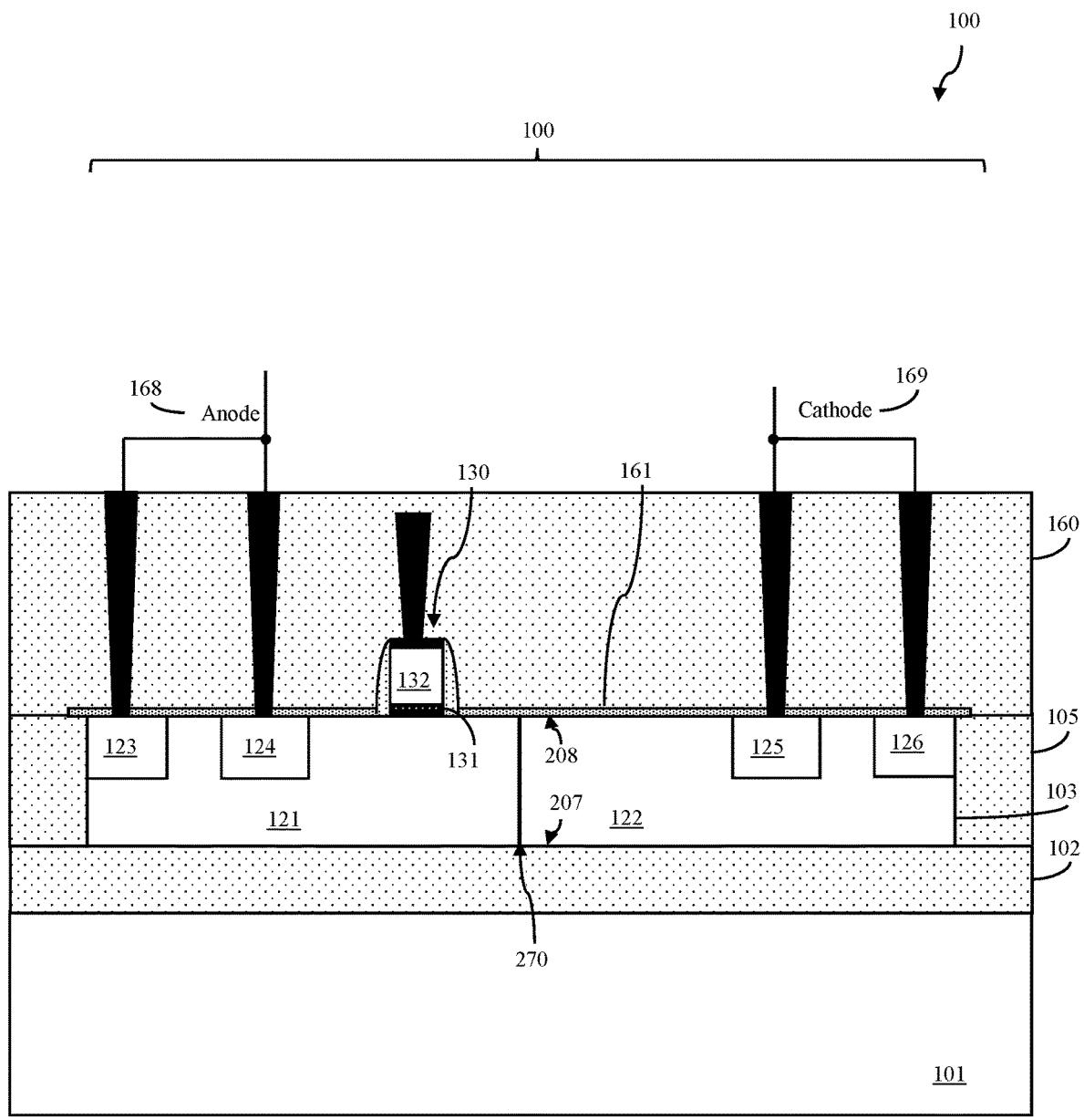
FIG. 4.1

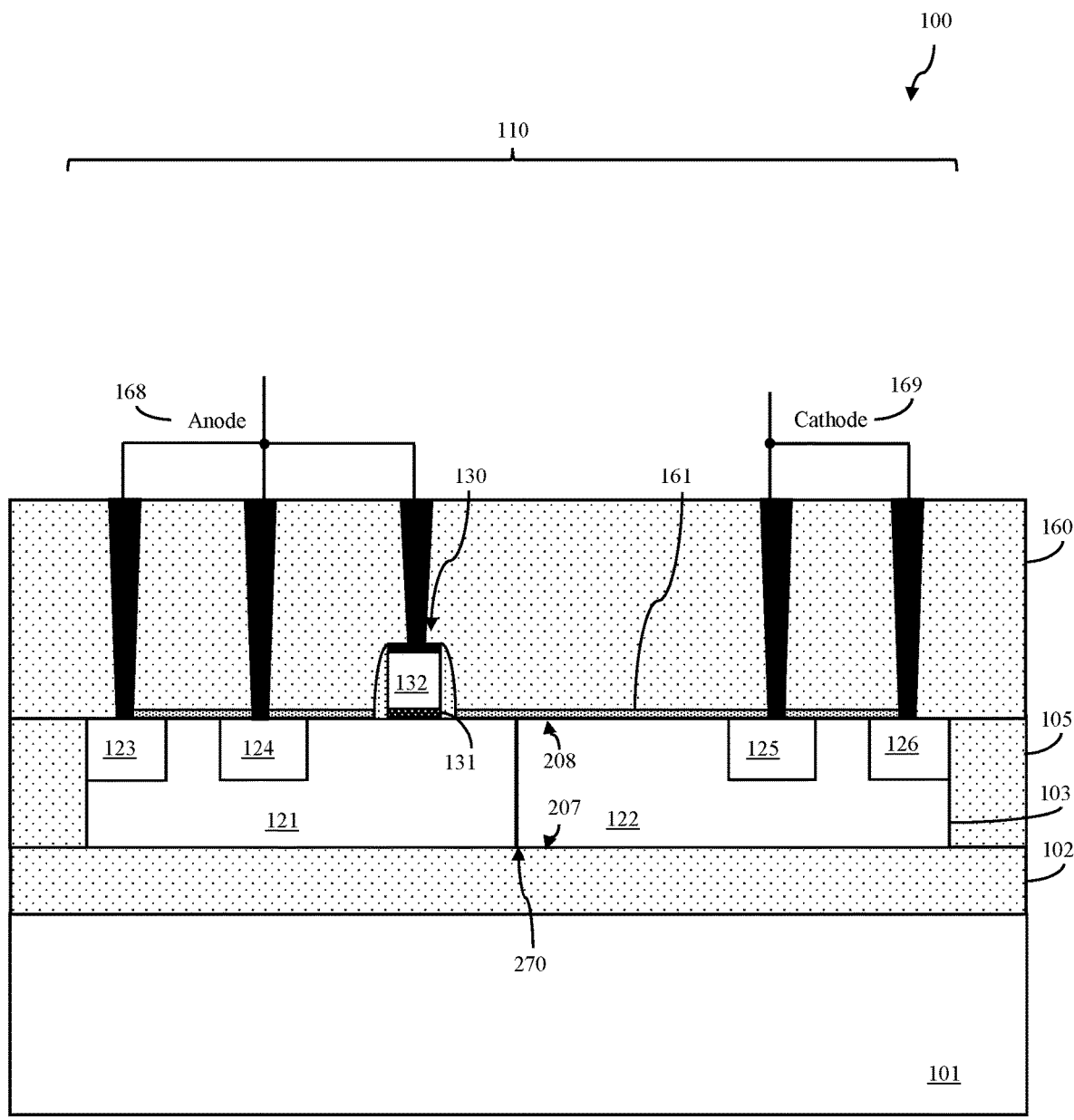
FIG. 4.2

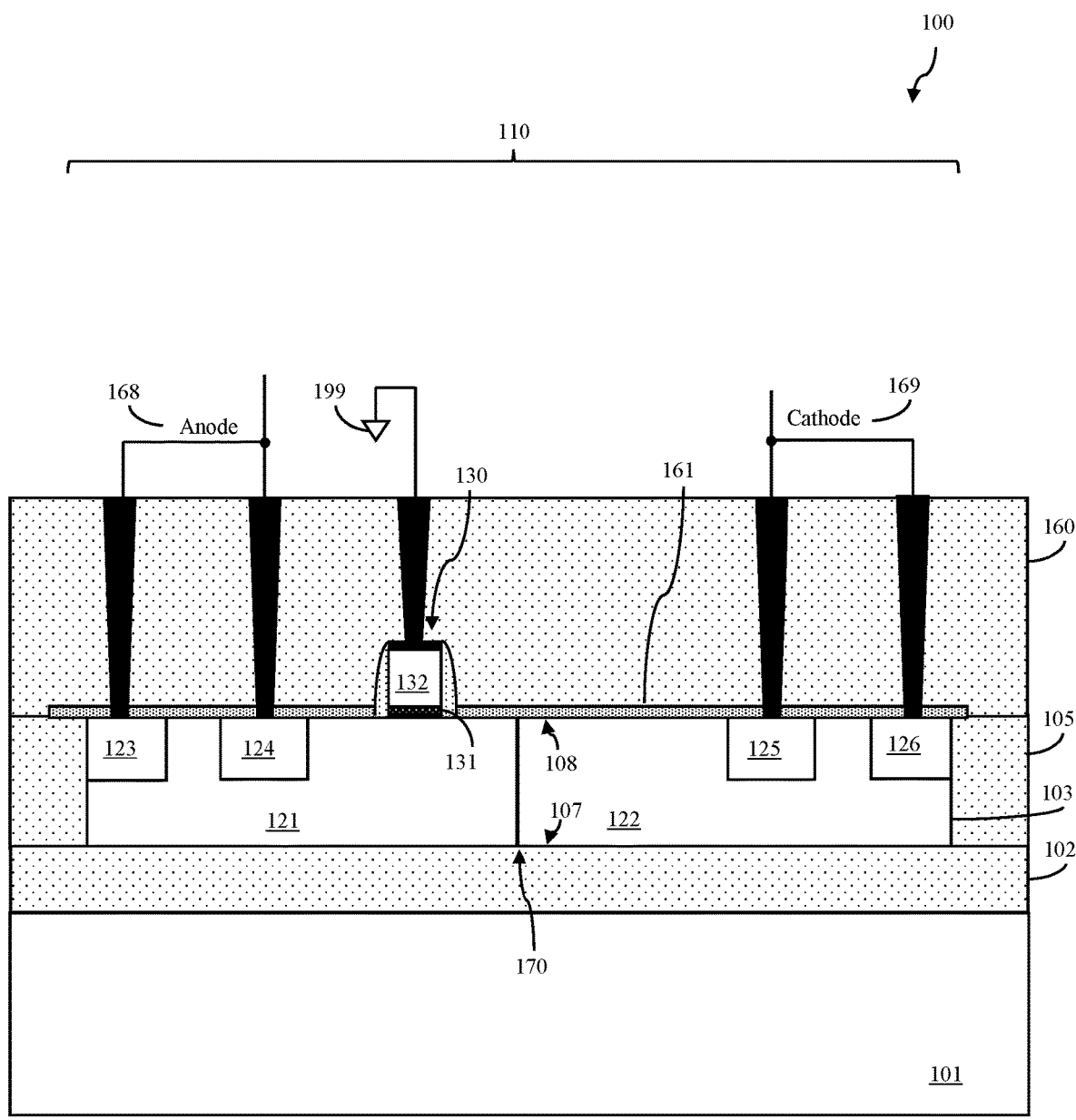
FIG. 4.3

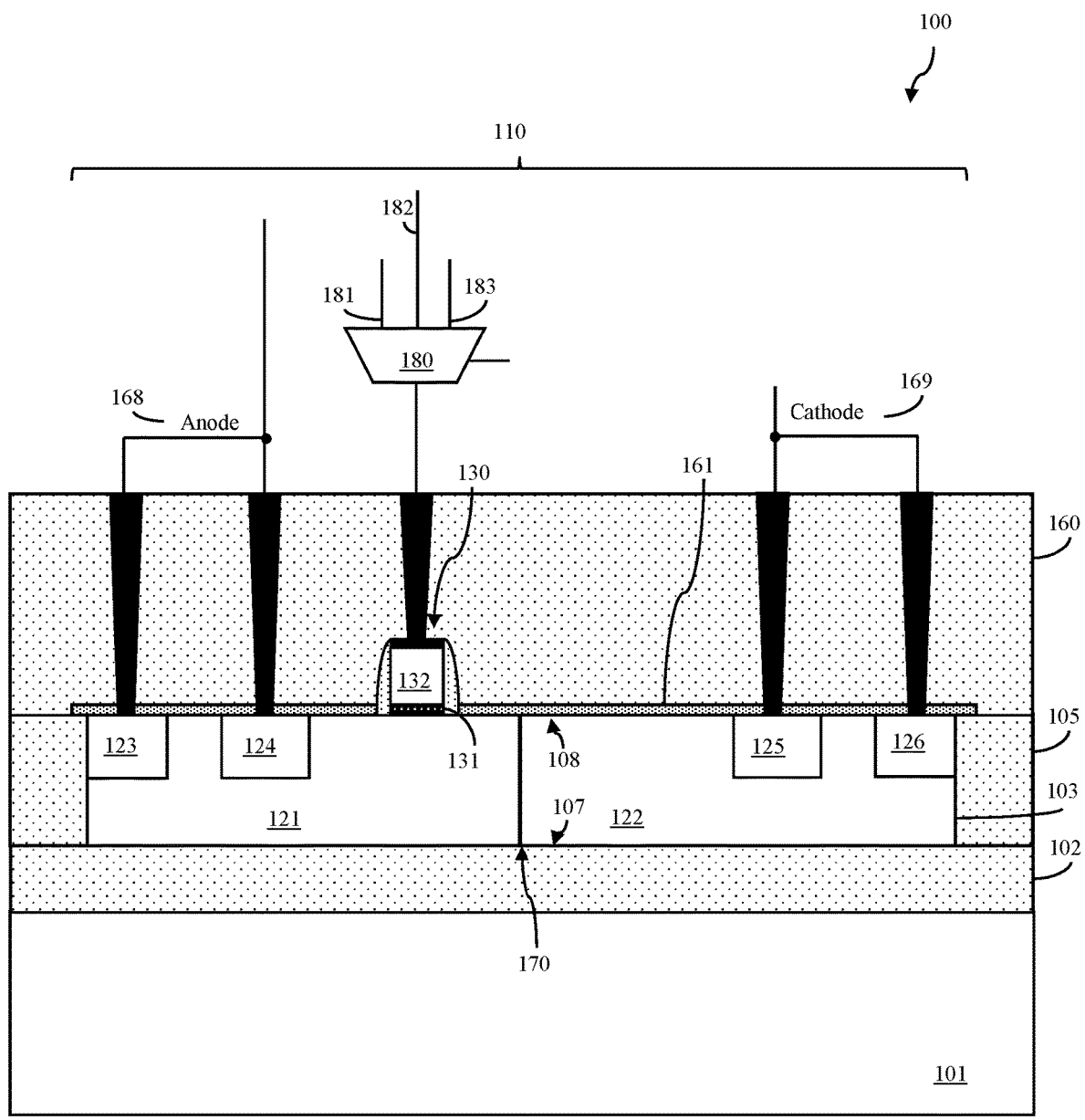
FIG. 4.4

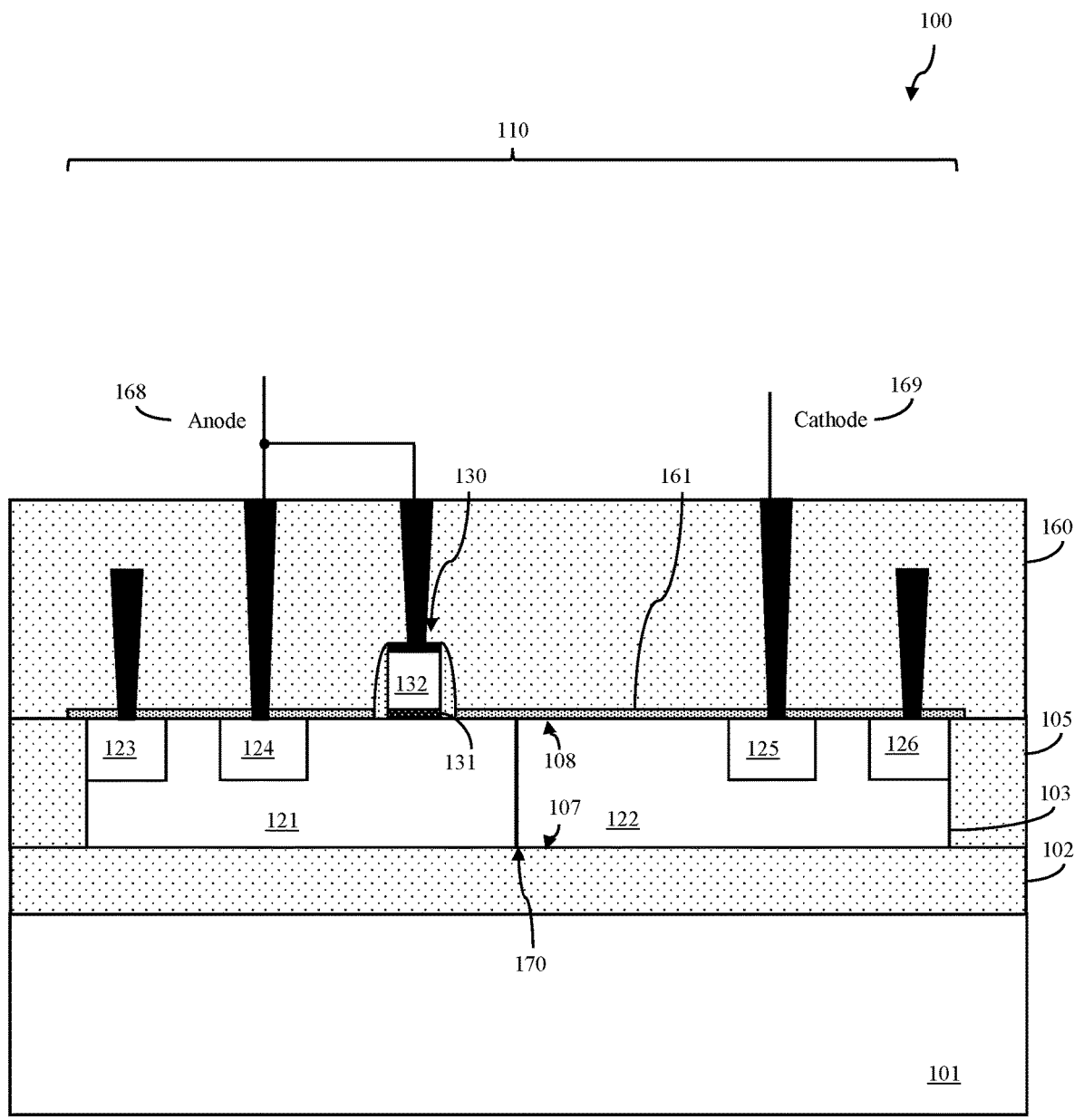
FIG. 4.5

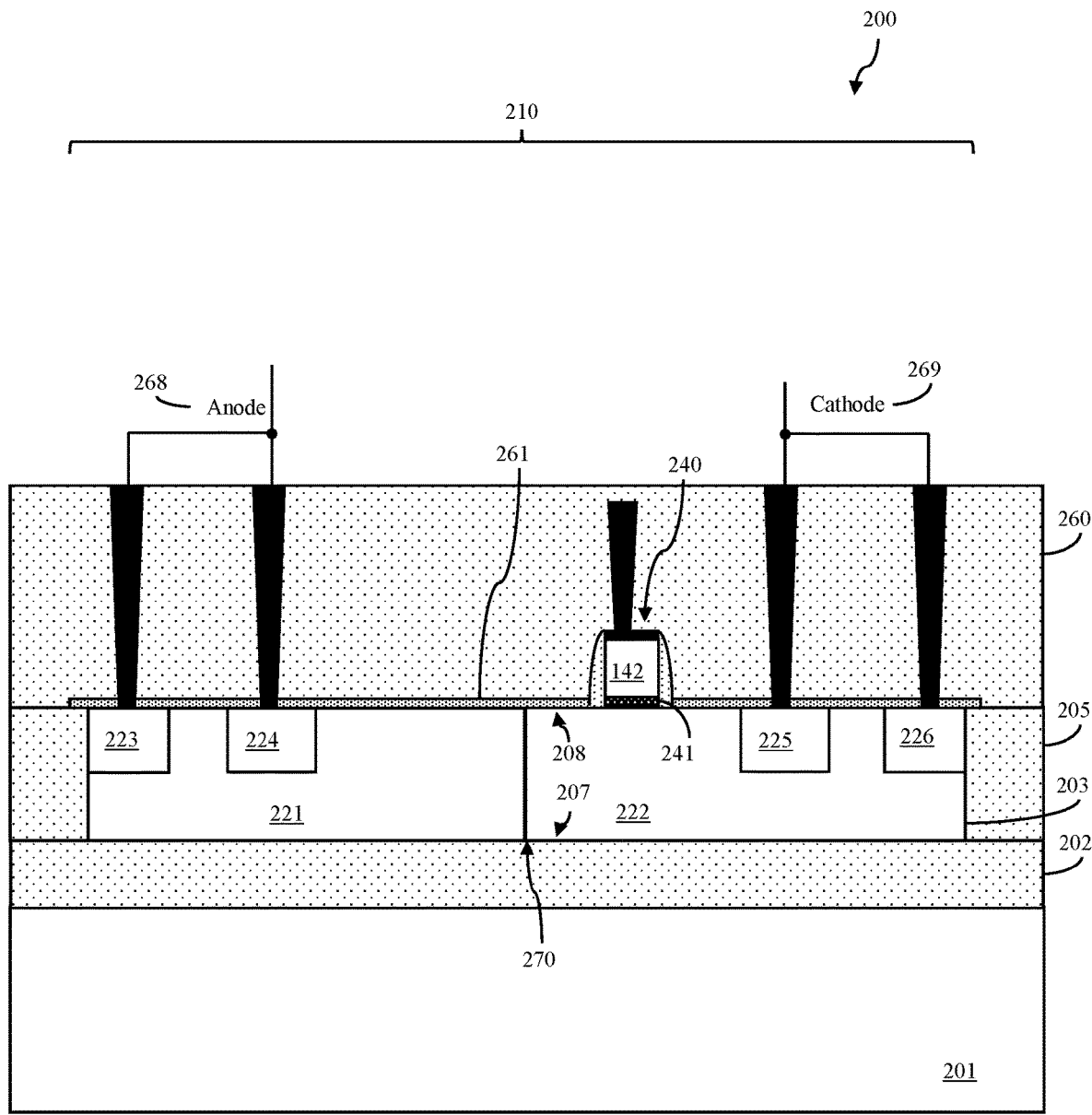
FIG. 5.1

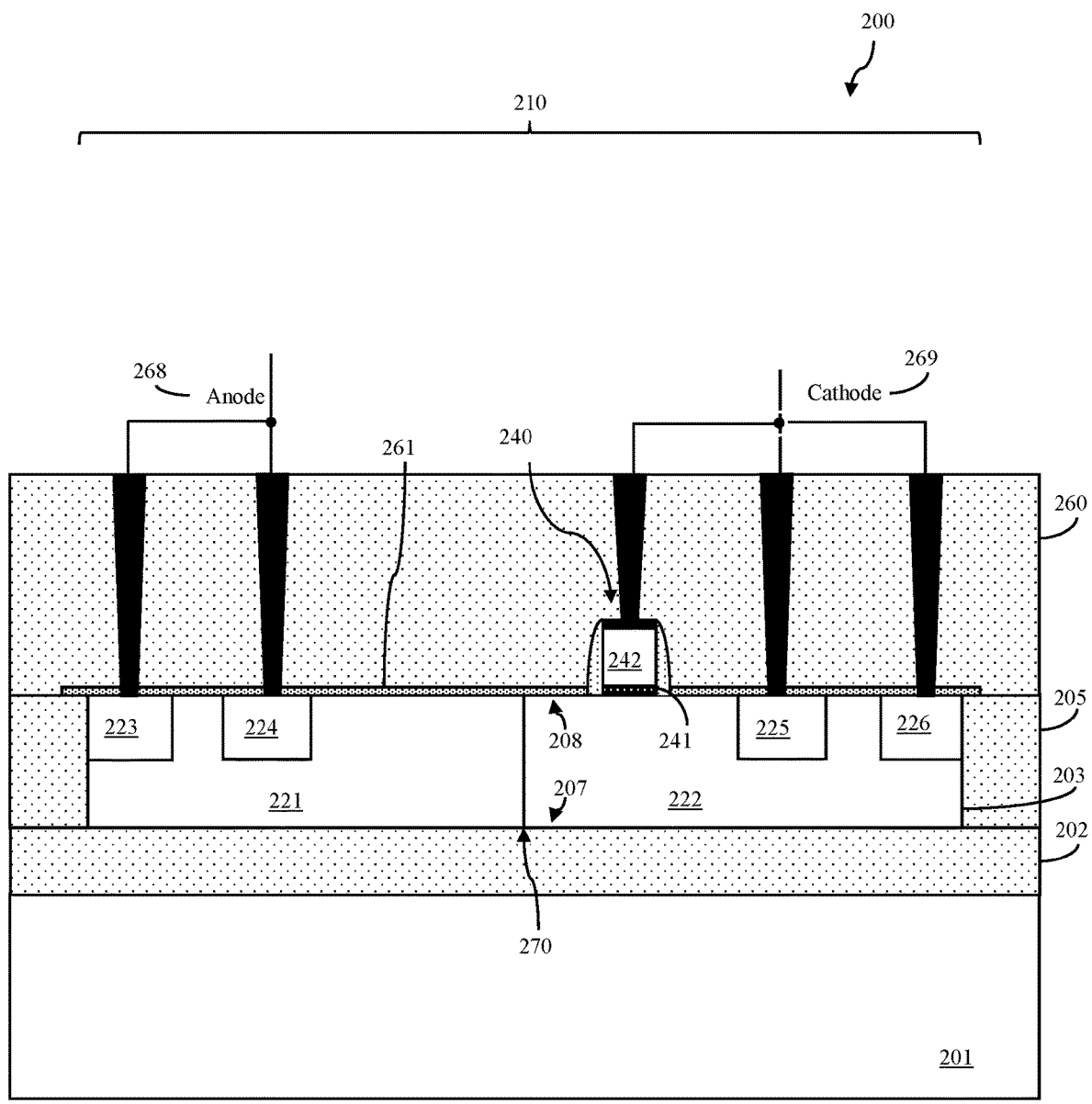
FIG. 5.2

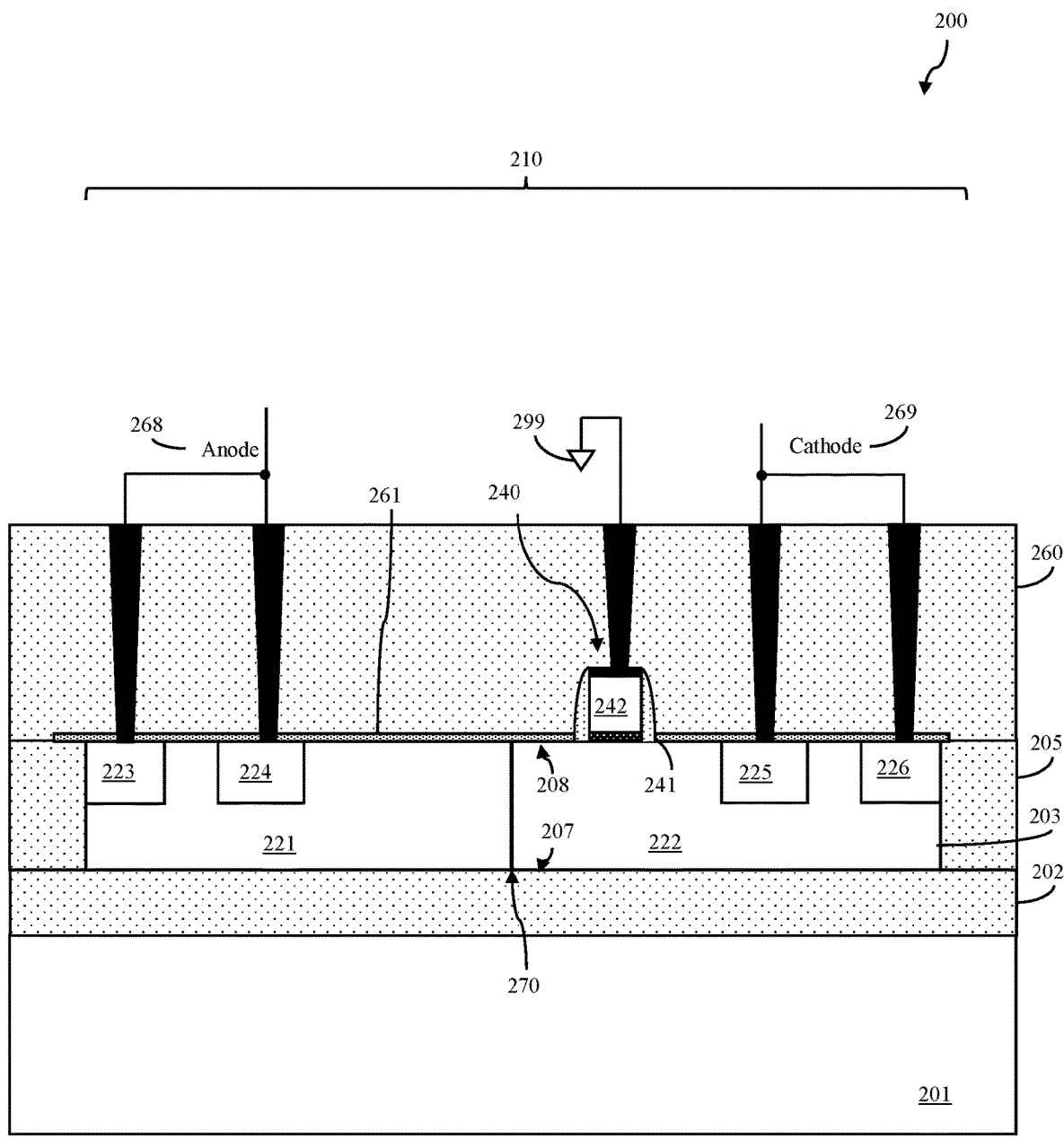
FIG. 5.3

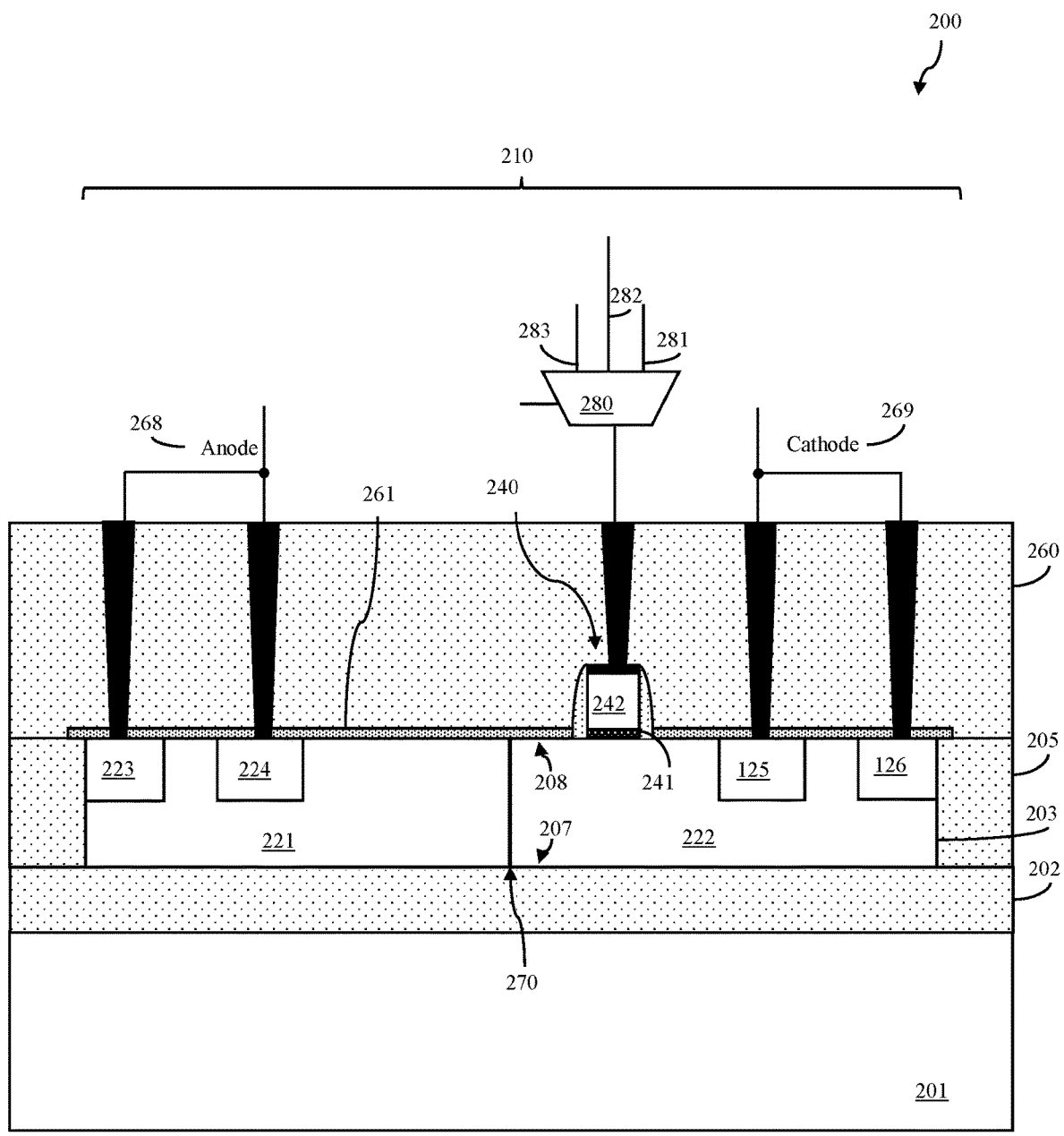
FIG. 5.4

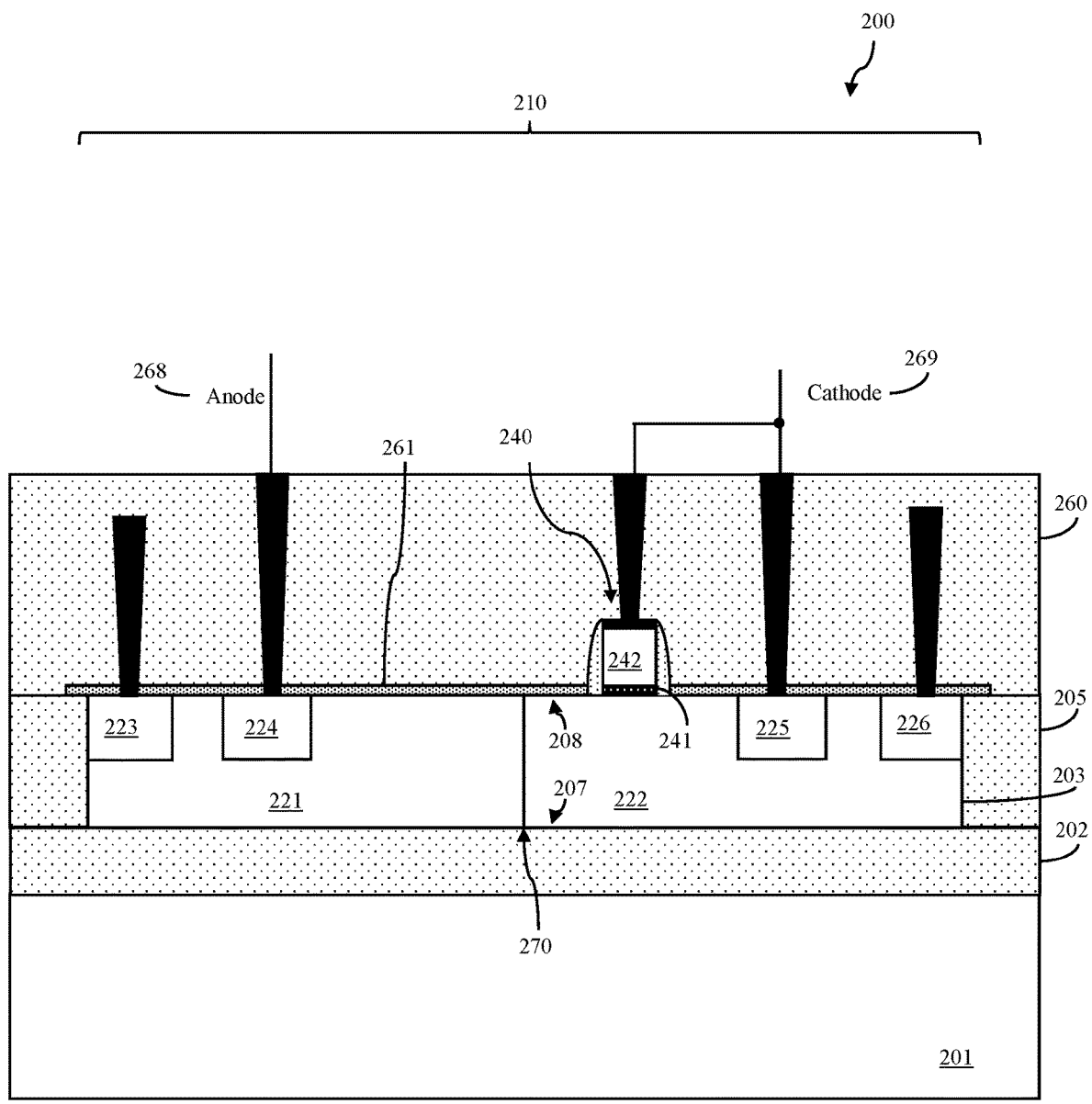
FIG. 5.5

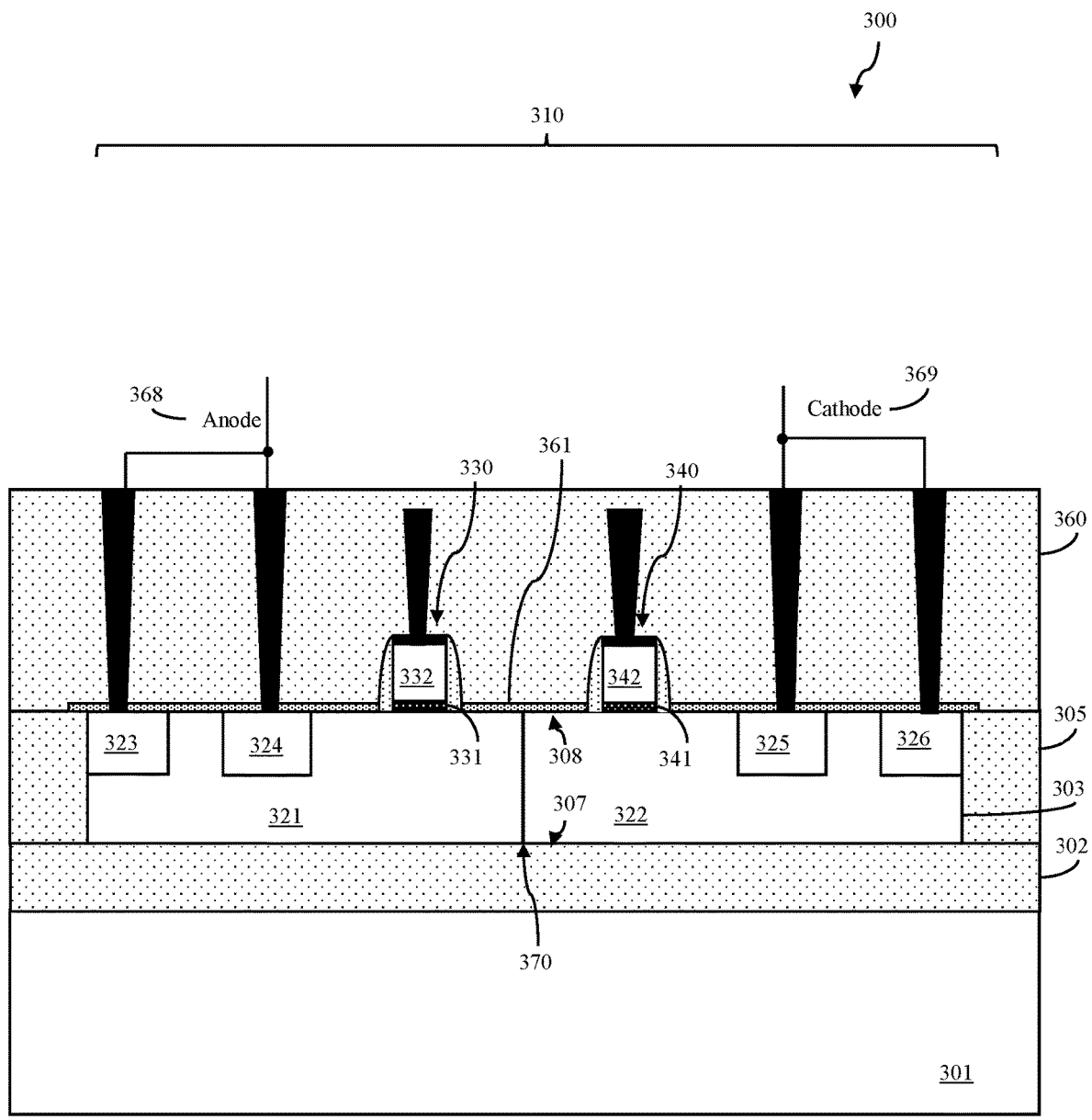
FIG. 6.1

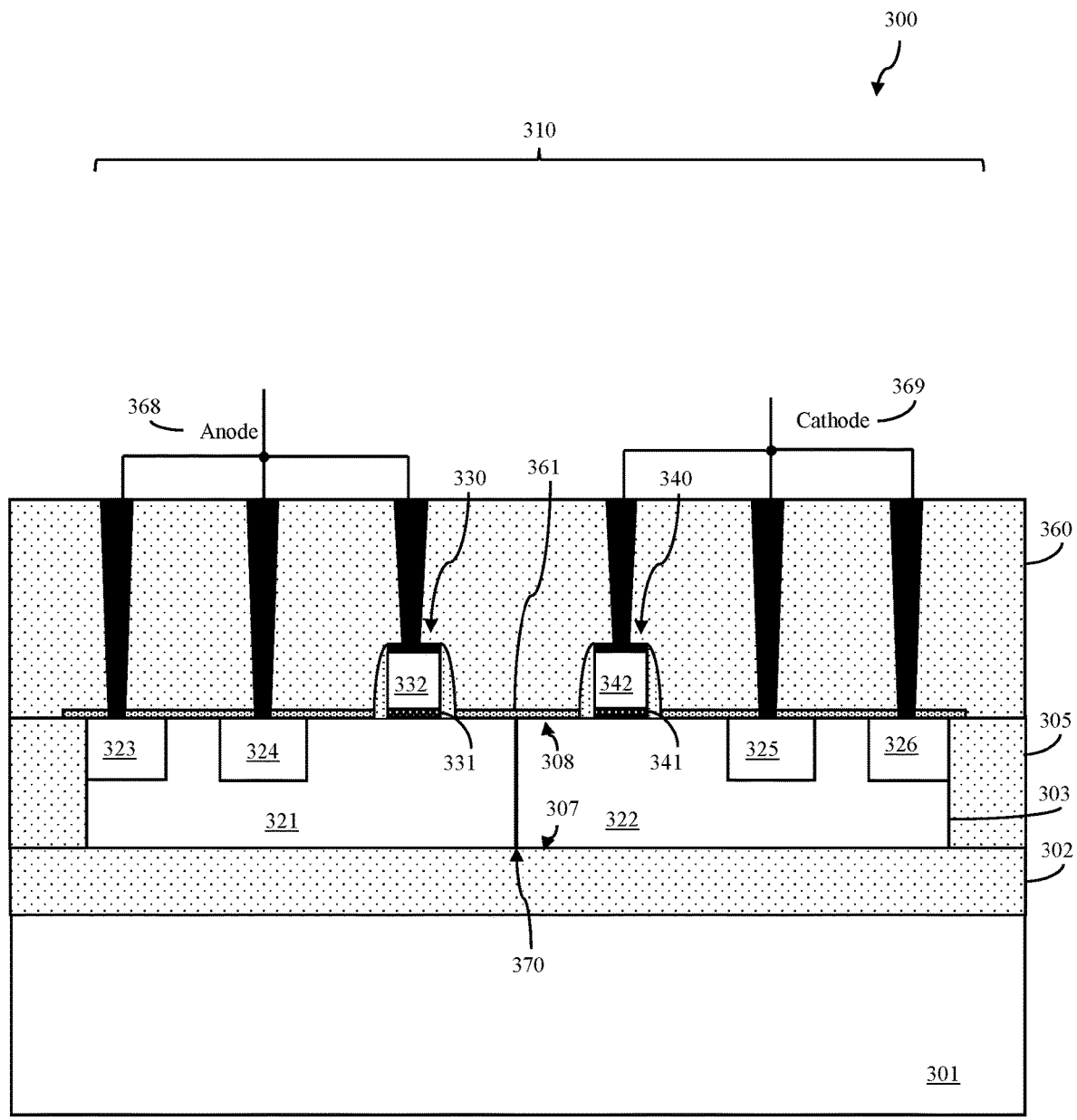
FIG. 6.2

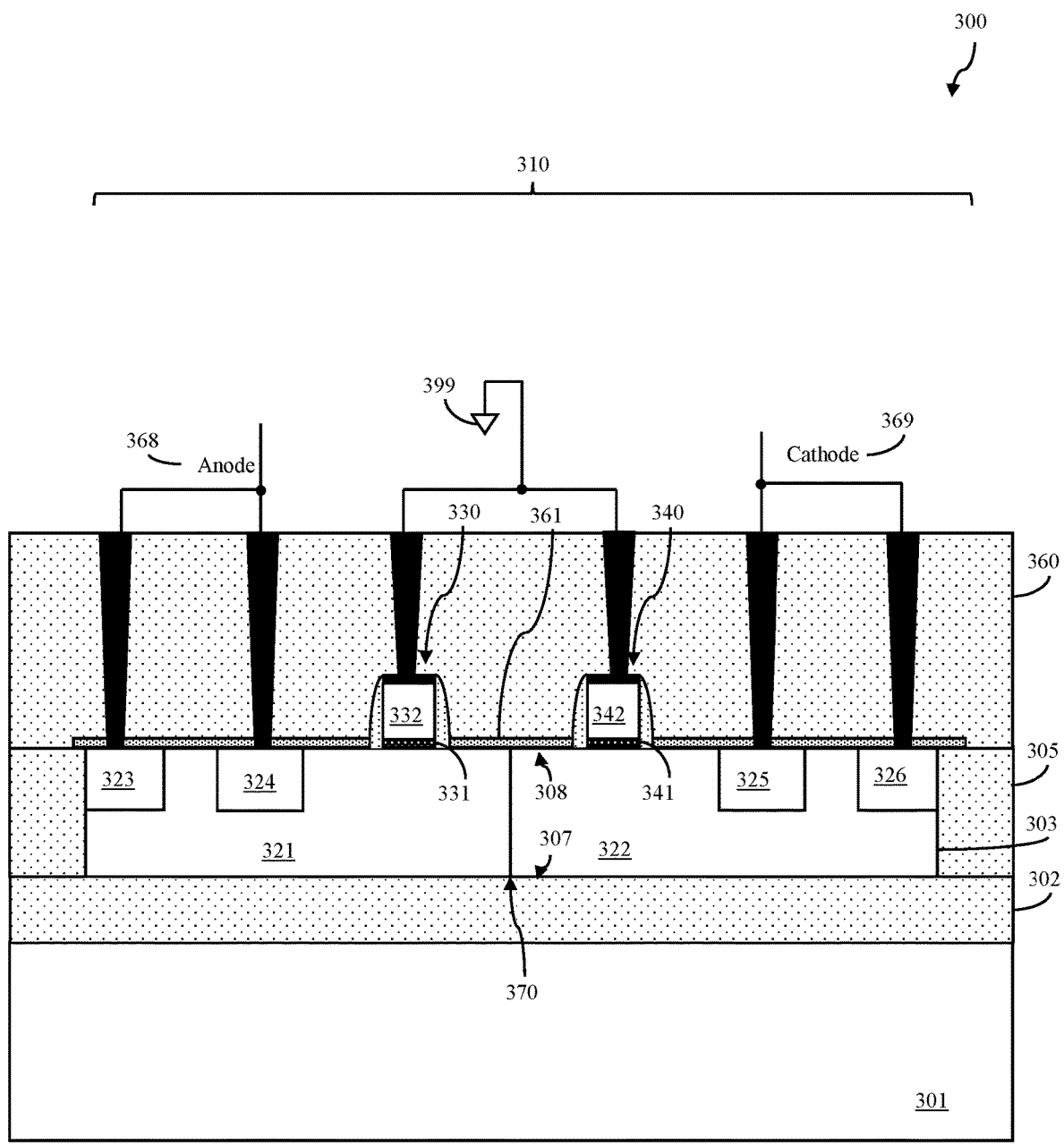
FIG. 6.3

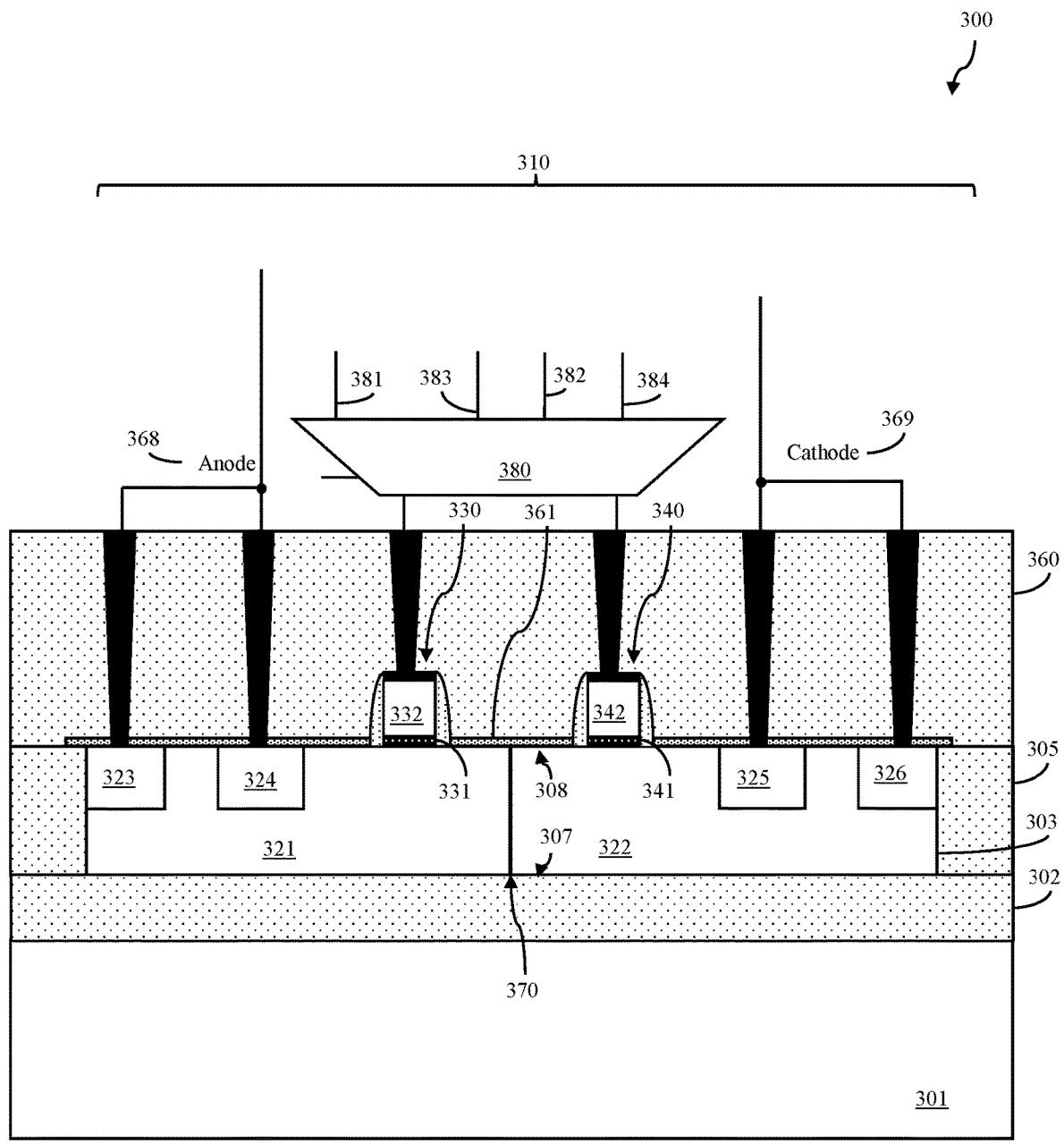
FIG. 6.4

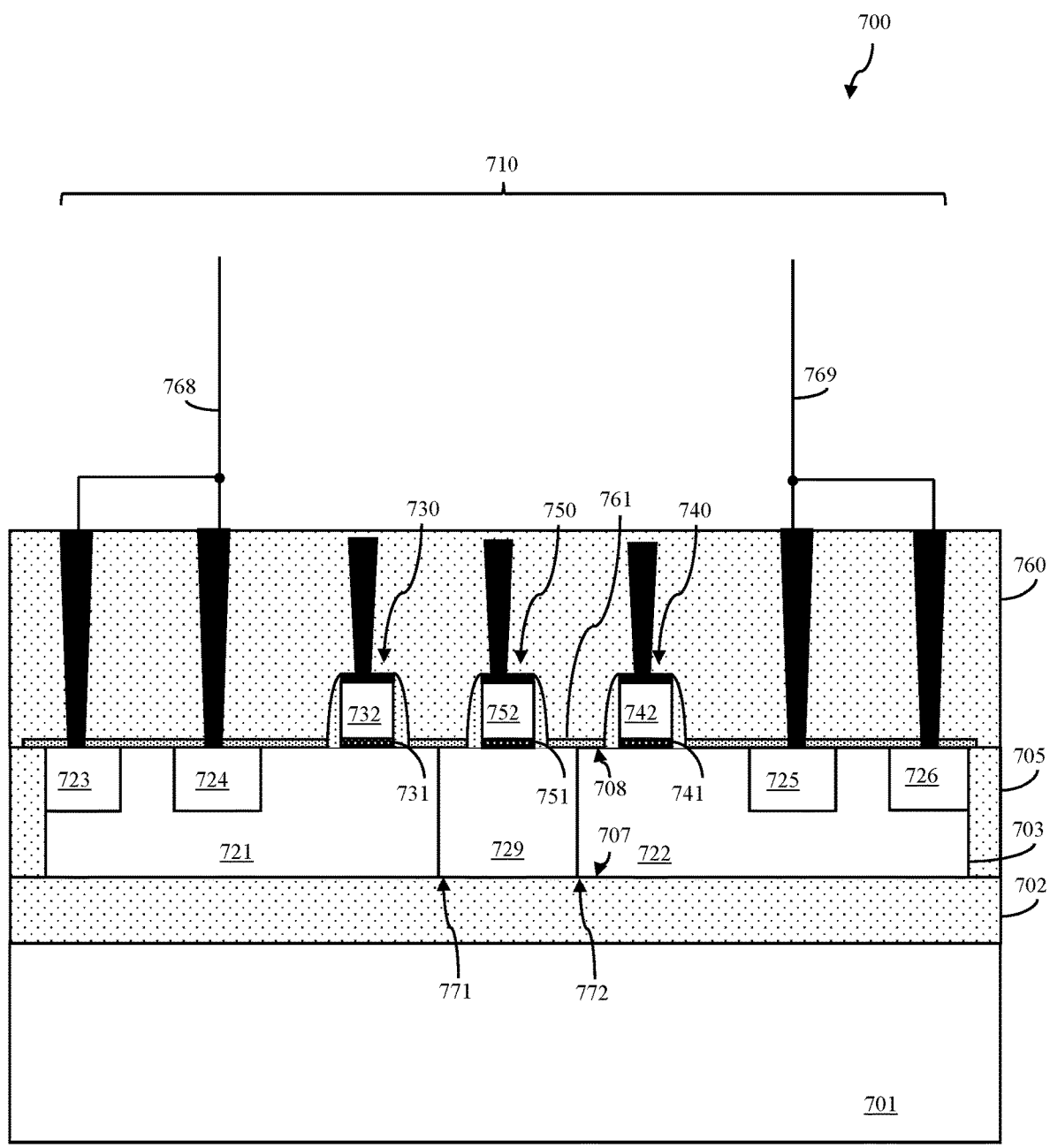
FIG. 8.1

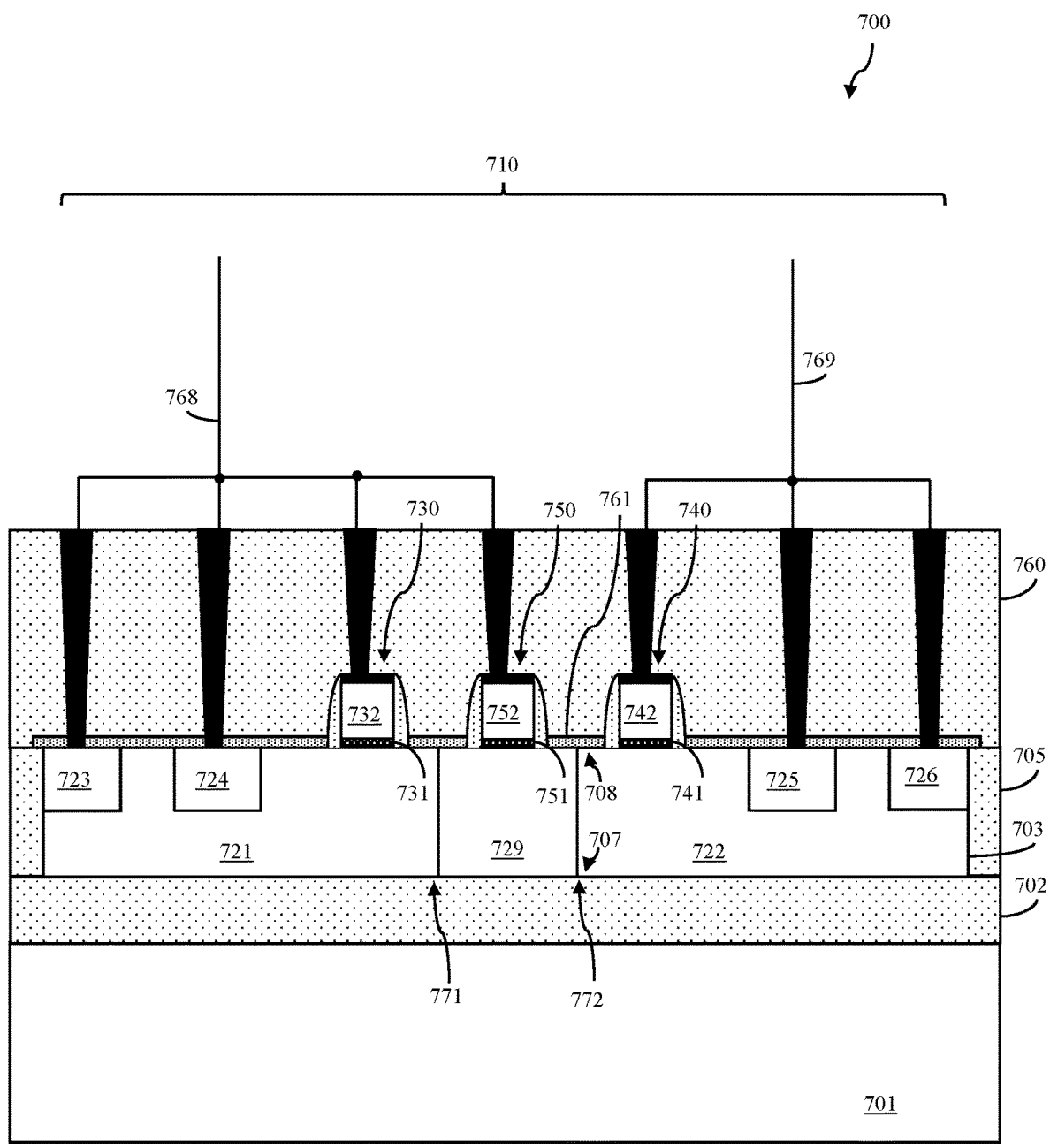
FIG. 8.2

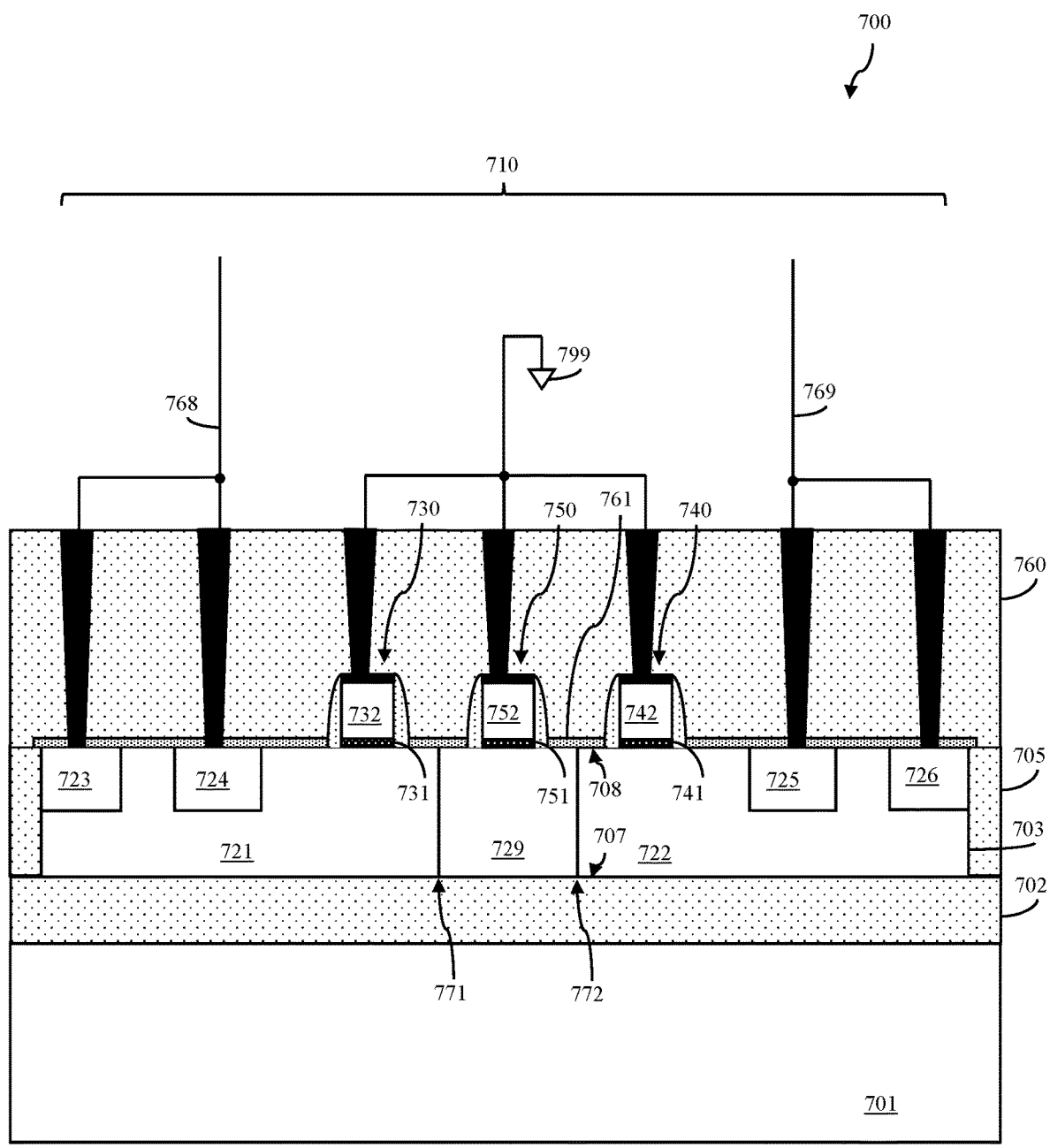
FIG. 8.3

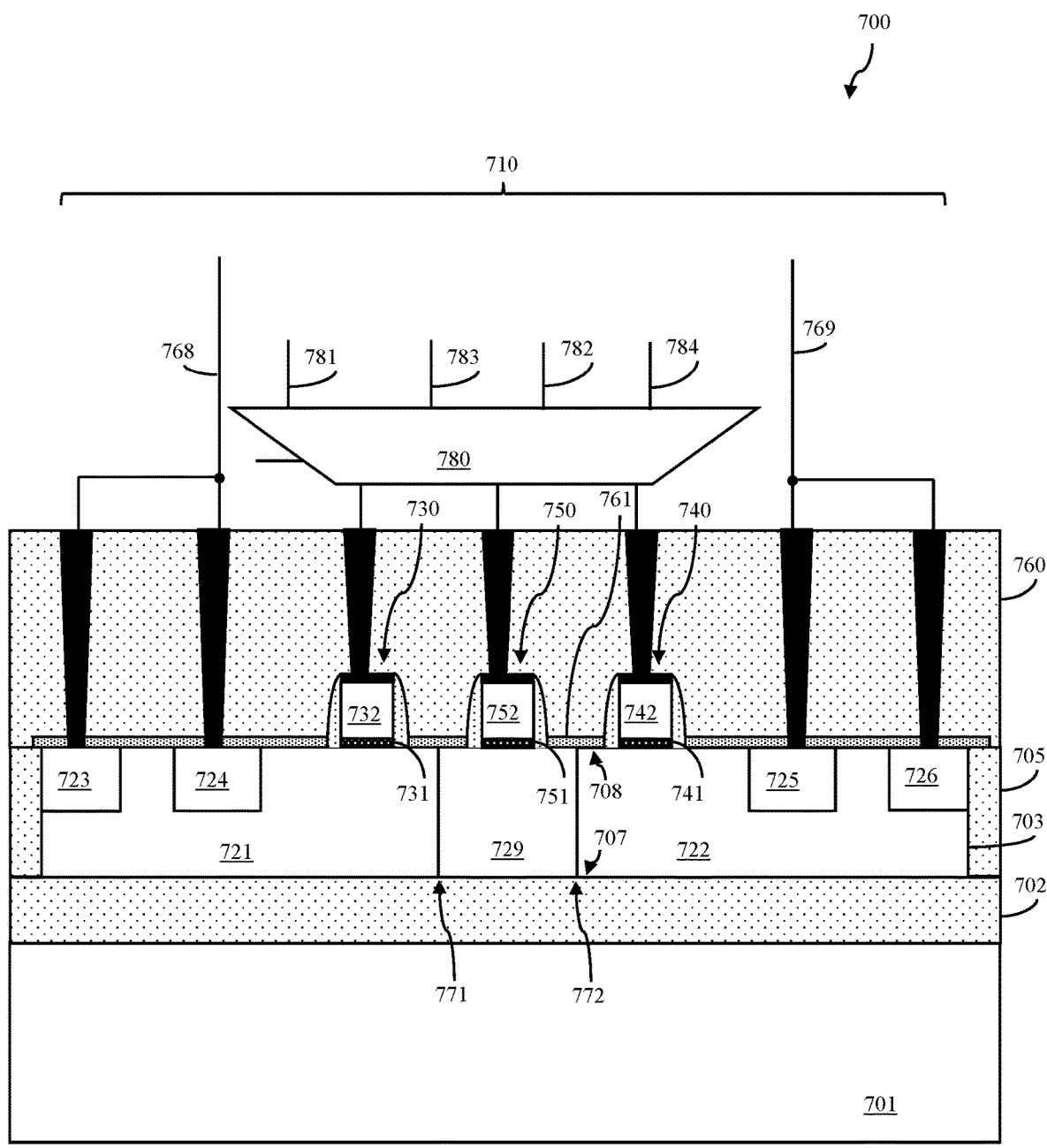
FIG. 8.4

GATE TUNNEL CURRENT-TRIGGERED SEMICONDUCTOR CONTROLLED RECTIFIER

BACKGROUND

The present invention relates to semiconductor controlled rectifiers (e.g., silicon controlled rectifiers (SCRs)) and, more particularly, to embodiments of a semiconductor structure including a semiconductor controlled rectifier with an adjustable trigger voltage.

Current flow through a semiconductor controlled rectifier is triggered in response to a specific input voltage (referred to herein as the trigger voltage (Vtrig)). Typically, Vtrig is a fixed value given the design of the semiconductor controlled rectifier. However, depending upon the application, it may be necessary to adjust Vtrig. Currently used techniques for adjusting Vtrig of an SCR include, for example, incorporating a field effect transistor (FET) into the SCR as an on/off switch, incorporating a gate structure into the SCR and using gate-induced drain leakage (GIDL) associated with the gate structure to adjust Vtrig, and incorporating a gate structure into the SCR and using a field associated with the gate structure to adjust Vtrig. Such techniques do not, however, allow for fine-tuning of Vtrig (i.e., relatively small Vtrig adjustments) to optimize performance.

SUMMARY

Disclosed herein are embodiments of a semiconductor structure. In some embodiments, the semiconductor structure can include a semiconductor layer having a first surface and a second surface opposite the first surface. The semiconductor structure can further include, within the semiconductor layer, an Nwell and a Pwell positioned laterally immediately adjacent to the Nwell. The semiconductor structure can further include a P-type diffusion region in the Nwell at the second surface and physically separated from a junction between the Nwell and the Pwell and an N-type diffusion region in the Pwell at the second surface and physically separated from the junction. The semiconductor structure can further include a gate on the second surface offset from the junction and between and physically separated from the P-type diffusion region and the N-type diffusion region.

In other embodiments, the semiconductor structure can include a semiconductor layer having a first surface and a second surface opposite the first surface. The semiconductor structure can further include, within the semiconductor layer, an Nwell in the semiconductor layer and a Pwell positioned laterally immediately adjacent to the Nwell. The semiconductor structure can further include a P-type diffusion region in the Nwell at the second surface and physically separated from a junction between the Nwell and the Pwell and an N-type diffusion region in the Pwell at the second surface and physically separated from the junction. The semiconductor structure can further include a first gate on the second surface immediately adjacent to the Nwell and physically separated from the P-type diffusion region and from the junction and a second gate on the second surface immediately adjacent to the Pwell and physically separated from the N-type diffusion region and from the junction.

In still other embodiments, the semiconductor structure can include a semiconductor layer having a first surface and a second surface opposite the first surface. The semiconductor structure can further include, within the semiconductor layer, a first well, a second well, and a third well positioned laterally between and immediately adjacent to the first well and the second well. The third well can have a different type conductivity than the first well and the second well. The semiconductor structure can further include first P-type and N-type diffusion regions in the first well at the second surface and physically separated from a first junction between the first well and the third well. The semiconductor structure can also include second P-type and N-type diffusion regions in the second well at the second surface and physically separated from a second junction between the second well and the third well. The semiconductor structure can further include: a first gate on the second surface immediately adjacent to the first well and physically separated from the first P-type and N-type diffusion regions and from the first junction; a second gate on the second surface immediately adjacent to the second well and physically separated from the second P-type and N-type diffusion regions and from the second junction; and a third gate on the second surface immediately adjacent to the third well and physically separated from the first junction and from the second junction.

BRIEF DESCRIPTION OF THE DRAWINGS

The present disclosure will be better understood from the following detailed description with reference to the drawings, which are not necessarily drawn to scale and in which:

FIGS. 4.1-4.5 are diagrams illustrating electrical connections for establishing different biasing conditions in the semiconductor controlled rectifier of FIG. 1A or FIG. 1B;

FIGS. 5.1-5.5 are diagrams illustrating electrical connections for establishing different biasing conditions in the semiconductor controlled rectifier of FIG. 2A or FIG. 2B;

FIGS. 6.1-6.4 are diagrams illustrating electrical connections for establishing different biasing conditions in the semiconductor controlled rectifier of FIG. 3A or FIG. 3B;

FIGS. 8.1-8.4 are diagrams illustrating electrical connections for establishing different biasing conditions in the semiconductor controlled rectifier of FIG. 7A or FIG. 7B.

DETAILED DESCRIPTION

As mentioned above, currently used techniques for adjusting Vtrig of an SCR include, for example, incorporating a field effect transistor (FET) into the SCR as an on/off switch, incorporating a gate structure into the SCR and using gate-induced drain leakage (GIDL) associated with the gate structure to adjust Vtrig, and incorporating a gate structure into the SCR and using a field associated with the gate structure to adjust Vtrig. Such techniques do not, however, allow for fine-tuning of Vtrig (i.e., relatively small Vtrig adjustments) to further improve performance.

In view of the foregoing, disclosed herein are embodiments of a structure including a semiconductor controlled rectifier or bi-directional semiconductor controlled rectifier with on-well gate(s) that can remain floating or can be biased to enable fine-tuning of the trigger voltage (Vtrig) through gate leakage current (as opposed to through an on/off switch or GIDL). Some disclosed structure embodiments include a semiconductor controlled rectifier with an Nwell and Pwell in a semiconductor layer, with a P-type diffusion region in the Nwell, and with an N-type diffusion region in the Pwell. Gate(s) on the well(s) can be separated from the junction between the wells, can be separated from the diffusion regions, and can be either left floating or biased to fine tune Vtrig using gate leakage current. Other disclosed structure embodiments include a bidirectional semiconductor controlled rectifier (e.g., a bidirectional SCR (BDSCR)) with a Pwell between first and second Nwells in a semiconductor layer, first P-type and N-type diffusion regions in the first Nwell, and second P-type and N-type diffusion regions in the second Nwell. Gate(s) on the well(s) can be separated from the junctions between the Nwells and the Pwell and from any of the diffusion regions. Again, these gate(s) can be either left floating or biased to fine tune Vtrig using gate leakage current.

Figure 1A:
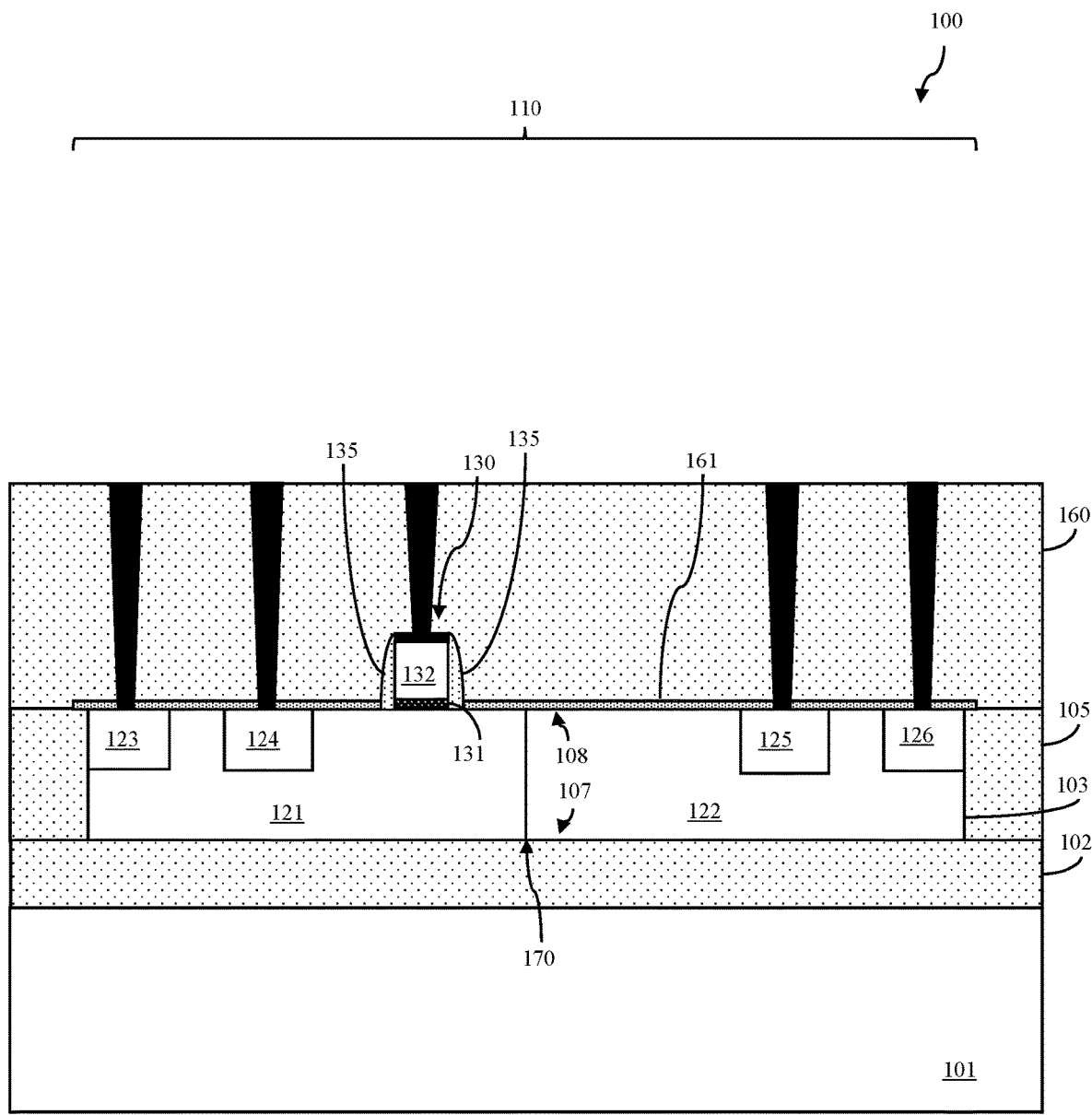
FIGS. 1A-1B are cross-section diagrams illustrating alternative configurations for an embodiment of a semiconductor structure.
Figure 1B:
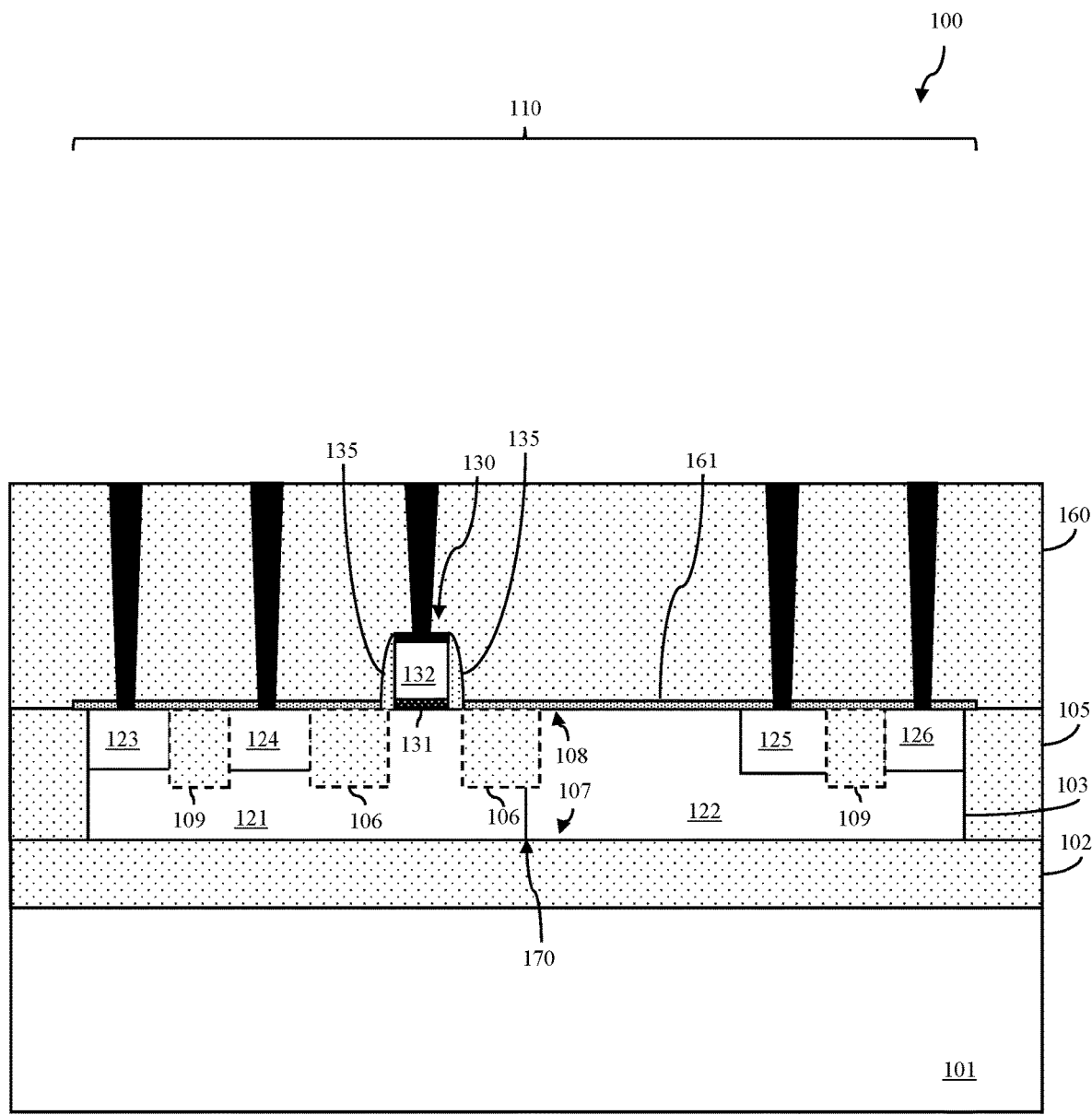
Figure 2A:
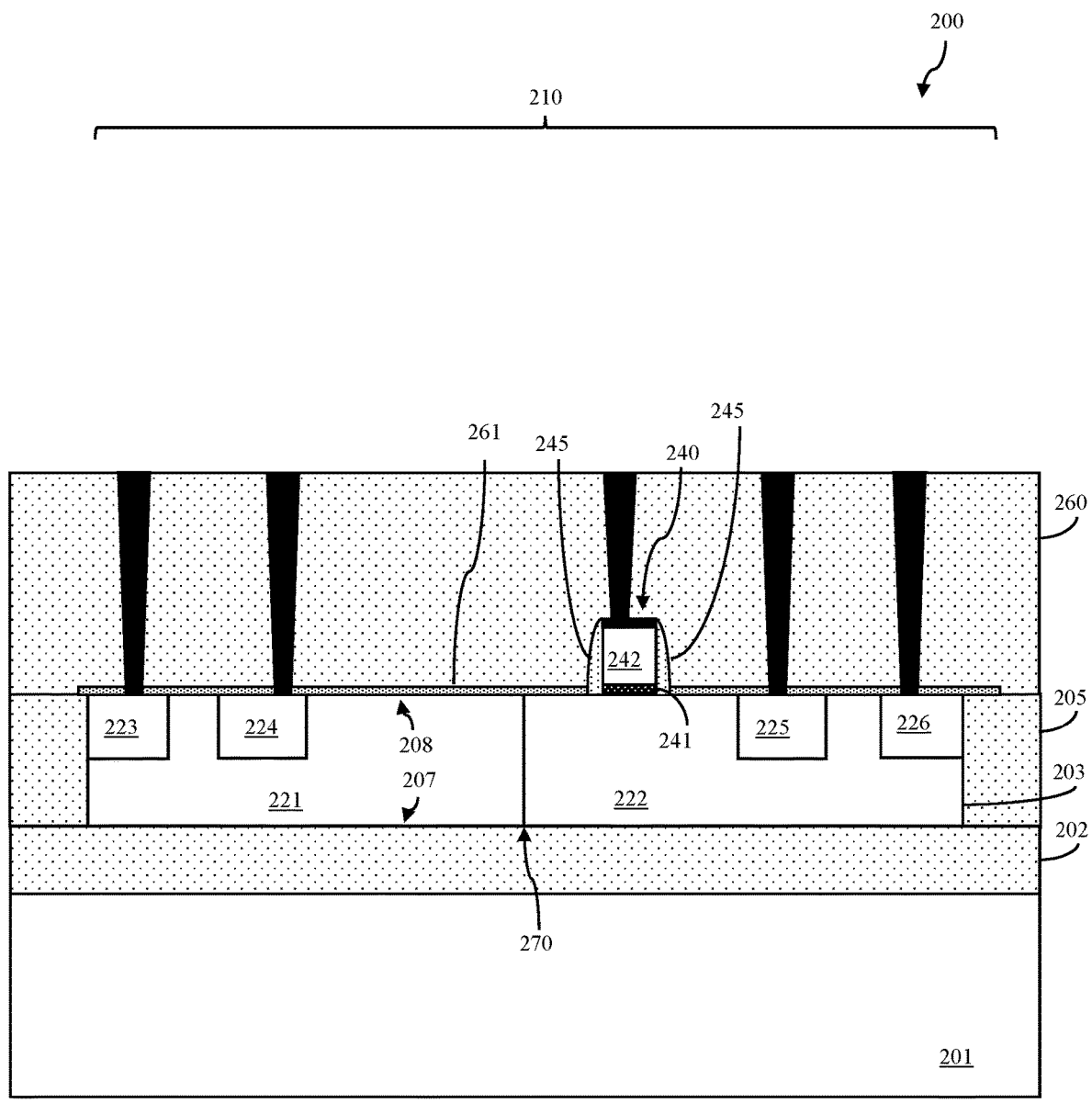
FIGS. 2A-2B are cross-section diagrams illustrating alternative configurations for another embodiment of a semiconductor structure.
Figure 2B:
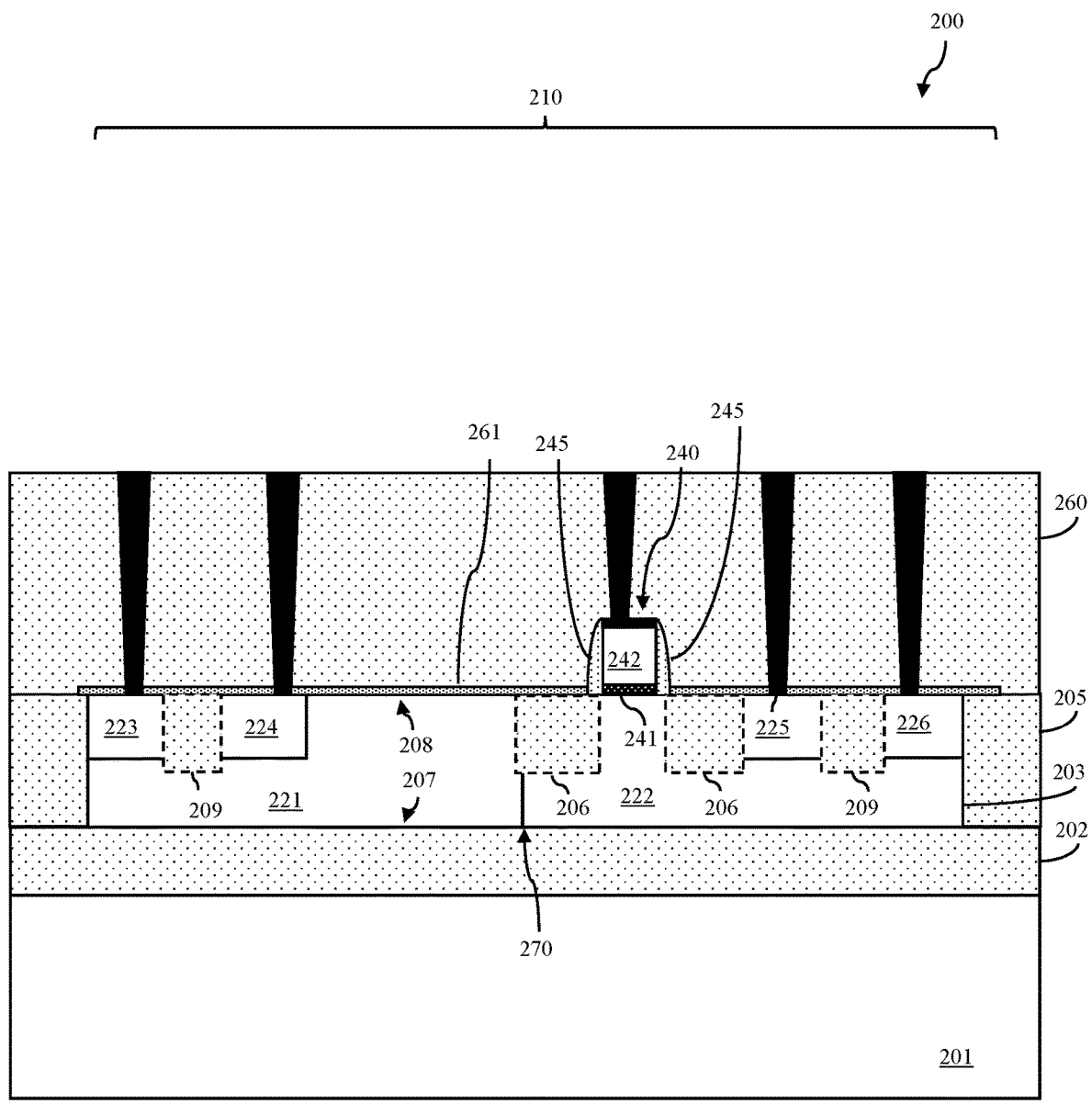
Figure 3A:
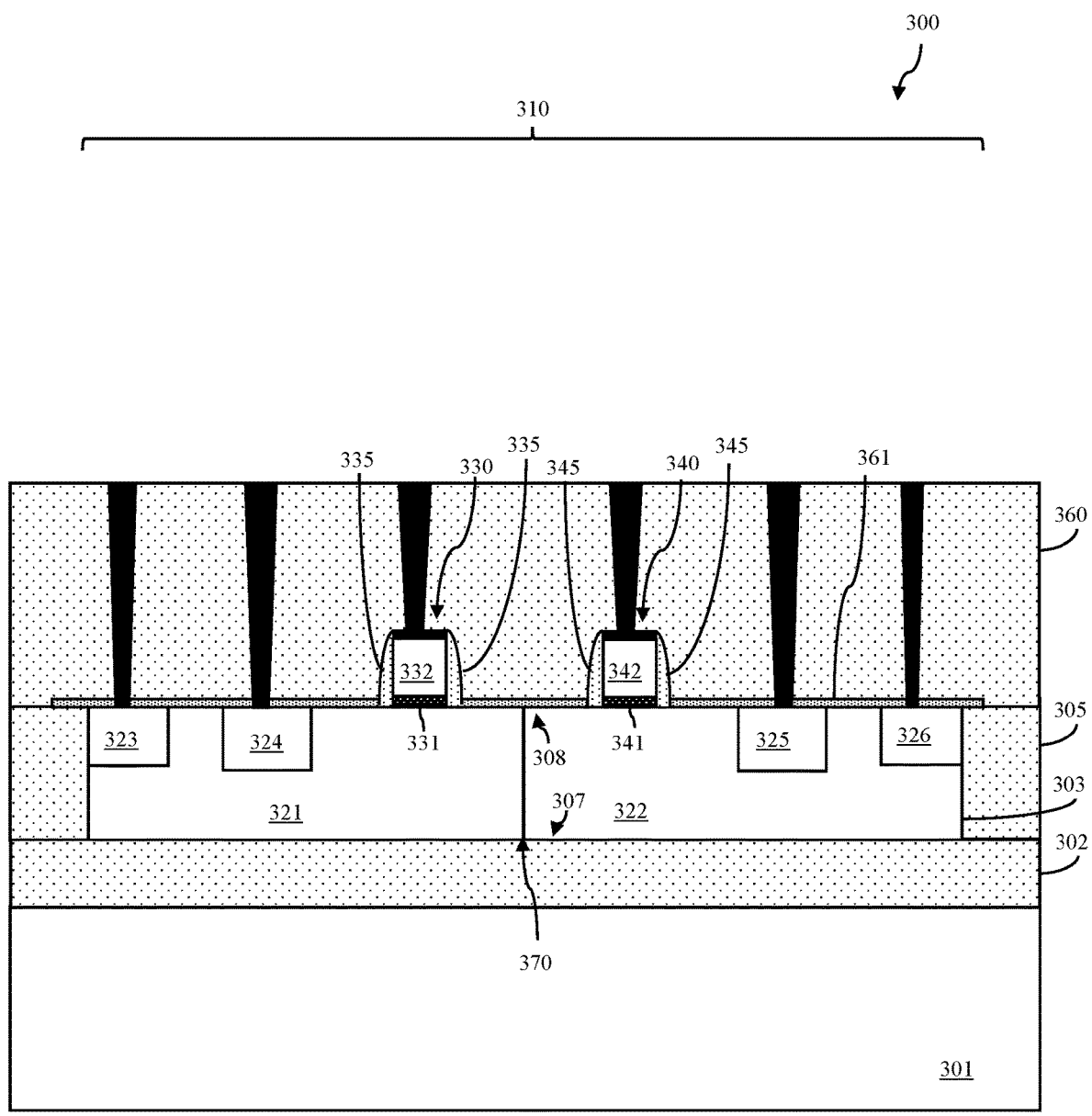
FIGS. 3A-3B are cross-section diagrams illustrating alternative configurations for another embodiment of a semiconductor structure.
Figure 3B:
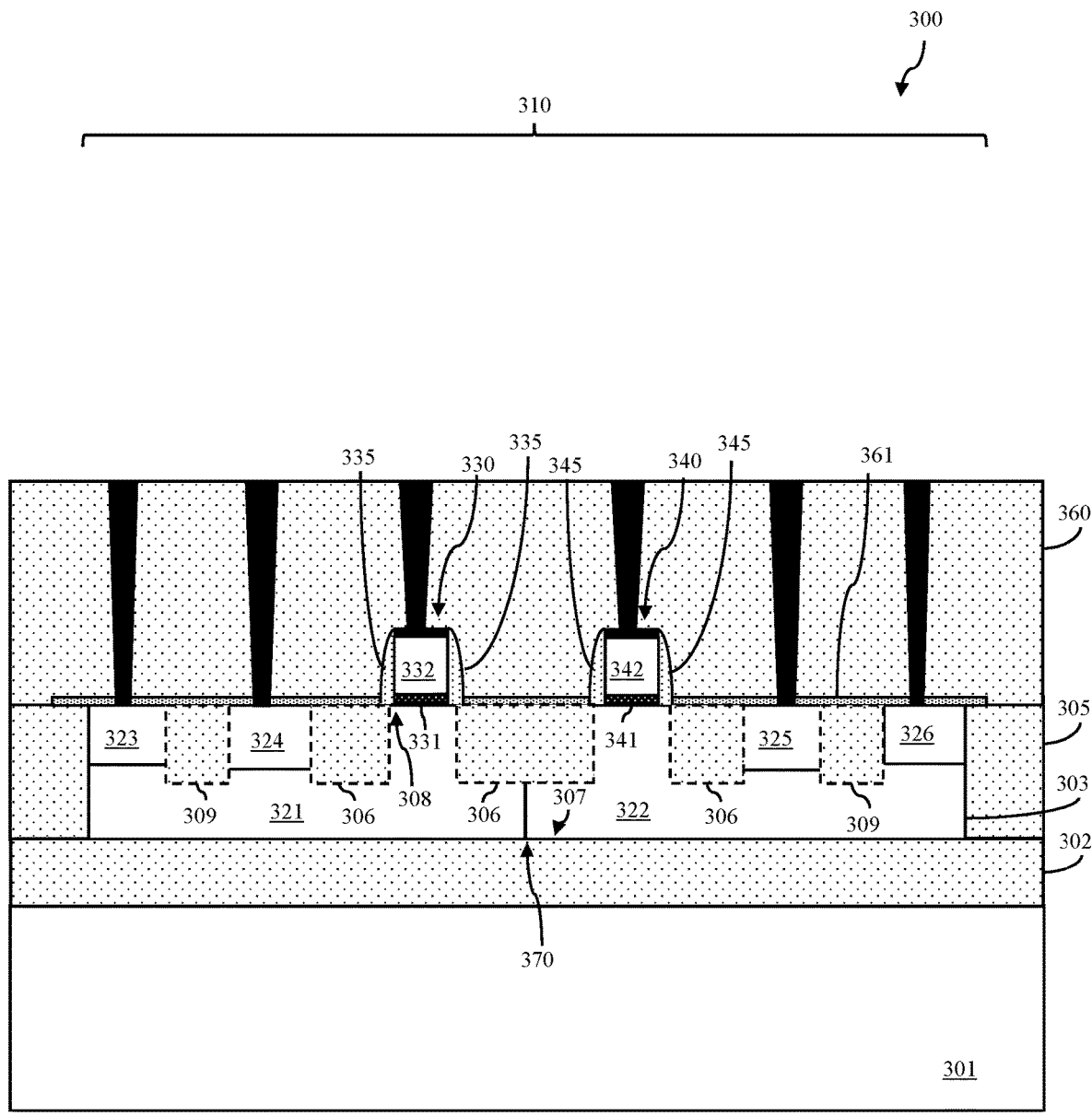

FIGS. 1A and 1B are cross-section diagrams illustrating alternative configurations for an embodiment of a semiconductor structure 100. FIGS. 2A and 2B are cross-section diagrams illustrating alternative configurations for another embodiment of a semiconductor structure 200. FIGS. 3A and 3B are cross-section diagrams illustrating alternative configurations for another embodiment of a semiconductor structure 300. As illustrated in FIGS. 1A-1B, 2A-2B, and 3A-3B, in each of the disclosed semiconductor structure embodiments 100, 200, 300 can include a semiconductor controlled rectifier 110, 210, 310, such as a silicon controlled rectifier (SCR). In these embodiments, the semiconductor controlled rectifier 110, 210, 310 is a unidirectional device with one or more on-well gates that enable fine-tuning of the voltage trigger (Vtrig) using gate leakage current.

More particularly, the semiconductor structure 100, 200, 300 can include a semiconductor layer 103, 203, 303. In some embodiments, as illustrated, the semiconductor structure 100, 200, 300 can be a semiconductor-on-insulator structure (e.g., a silicon-on-insulator (SOI) structure). That is, the semiconductor structure 100, 200, 300 can include a semiconductor substrate 101, 201, 301 (e.g., a silicon (Si) substrate), an insulator layer 102, 202, 302 (e.g., a silicon dioxide ($SiO_2$) layer or some other suitable insulator layer) on the semiconductor substrate 101, 201, 301 and a monocrystalline semiconductor layer 103, 203, 303 (e.g., a Si layer or a layer of some other suitable monocrystalline semiconductor material) on the insulator layer 102, 202, 302. However, it should be understood that the figures are not intended to be limiting.

Thus, for example, the semiconductor structure could be a bulk semiconductor structure where the semiconductor layer is a bulk semiconductor substrate (e.g., a bulk Si substrate). In any case, the semiconductor layer 103, 203, 303 can have a first surface 107, 207, 307 (e.g., a bottom surface) and a second surface 108, 208, 308 (e.g., a top surface) opposite the first surface.

The semiconductor structure 100, 200, 300 can further include a semiconductor controlled rectifier 110, 210, 310 (e.g., an SCR). Those skilled in the art will recognize that a semiconductor controlled rectifier is a unidirectional solid-state current-controlling device with four-layer p-n-p-n switching.

Specifically, the semiconductor controlled rectifier 110, 210, 310 can include an active device region in the semiconductor layer 103, 203, 303. The boundaries of the active device region can, for example, be defined by shallow trench isolation (STI) structures 105, 205, 305. That is, STI structures 105, 205, 305 can laterally surround a portion of the semiconductor layer referred to herein as the active device region. Those skilled in the art will recognize that an STI structure refers to structure include a trench etched into the surface of the semiconductor layer and filled with one or more layers of isolation material. Such STI structures 105, 205, 305 can, for example, extend vertically from the top surface of the semiconductor layer to the insulator layer. In the semiconductor controlled rectifier 110, 210, 310 the four layers mentioned above can include, within the active device region of the semiconductor layer 103, 203, 303, an Nwell 121, 221, 321 and a Pwell 122, 222, 322 positioned laterally immediately adjacent to the Nwell 121, 221, 321, thereby forming a PN junction 170, 270, 370. For purposes of this disclosure, a well refers to a semiconductor region doped with one or more dopants (e.g., through a dopant implantation process or otherwise doped) so as to have a specific type of conductivity. A Pwell is a well doped so as to have P-type conductivity, whereas an Nwell is a well doped so as to have N-type conductivity. Those skilled in the art will recognize that the dopant(s) will vary depending upon the semiconductor material, as discussed in greater detail below. In any case, the Nwell 121, 221, 321 and the Pwell 122, 222, 322 can extend into the semiconductor layer 103, 203, 303 from the second surface 108, 208, 308 toward or to the first surface 107, 207, 307. In the semiconductor controlled rectifier 110, 210, 310 the four layers can also include a pair of diffusion regions and, particularly, a P-type diffusion region 124, 224, 324 (which is connected to an anode terminal, as discussed in greater detail below) and an N-type diffusion region 125, 225, 325 (which is connected to a cathode terminal, as discussed in greater detail below). For purposes of this disclosure, diffusion regions, like wells, can be semiconductor regions doped with one or more dopants (e.g., through a dopant implantation process or otherwise doped) so as to have a specific type of conductivity. However, typically, diffusion regions are seated within wells and are doped so as to have higher conductivity level than the adjacent wells. In this case, the P-type diffusion region 124, 224, 324 can be within the Nwell 121, 221, 321 extending vertically from the second surface 108, 208, 308 toward but not to the bottom of the Nwell 121, 221, 321 and spaced laterally away from the PN junction 170, 270, 370 (i.e., the P-type diffusion region 124, 224, 324 can be physically separated by some distance from the PN junction 170, 270, 370). This P-type diffusion region 124, 224, 324 can have P-type conductivity at a higher conductivity level than the Pwell 122, 222, 322. That is, it can be a P+ region. The N-type diffusion region 125, 225, 325 can be within the Pwell 122, 222, 322 extending vertically from the second surface 108, 208, 308 toward but not to the bottom of the Pwell 122, 222, 322 and spaced laterally away from the PN junction 170, 270, 370 (i.e., the N-type diffusion region 125, 225, 325 can be physically separated by some distance from the PN junction 170, 270, 370). This N-type diffusion region 125, 225, 325 can have P-type conductivity at a higher conductivity level than the Pwell 122, 222, 322. That is, it can be a N+ region. Thus, the four layers include the P-type diffusion region 124, 224, 324, the Nwell 121, 221, 321, the Pwell 122, 222, 322 and the N-type diffusion region 125, 225, 325.

The semiconductor controlled rectifier 110, 210, 310 can further include a pair of contact regions and, particularly, an N-type contact region 123, 223, 323 and a P-type contact region 126, 226, 326. For purposes of this disclosure, contact regions, like diffusion regions, can be semiconductor regions doped with one or more dopants (e.g., through a dopant implantation process or otherwise doped) so as to have a specific type of conductivity. Typically, they are seated in wells with the same type conductivity and have a higher conductivity level than the adjacent wells. As discussed in greater detail below, such contact regions can be contacted in order to allow the adjacent wells to be biased, as needed. In this case, the N-type contact region 123, 223, 323 can be within the Nwell 121, 221, 321 extending vertically from the second surface 108, 208, 308 toward but not to the bottom of the Nwell 121, 221, 321 and spaced laterally away from (i.e., physically separated from) the PN junction 170, 270, 370 and the P-type diffusion region 124, 224, 324. The P-type contact region 126, 226, 326 can be within the Pwell 122, 222, 322 extending vertically from the second surface 108, 208, 308 toward but not to the bottom of the Pwell 122, 222, 322 and spaced laterally away from (i.e., physically separated from) the PN junction 170, 270, 370 and the N-type diffusion region 125, 225, 325. As illustrated in FIGS. 1B, 2B, and 3B, optionally, additional STI structures 109, 209, 309 can be positioned laterally between the N-type contact region 123, 223, 323 and the P-type diffusion region 124, 224, 324 and/or the P-type contact region 126, 226, 326 and the N-type diffusion region 125, 225, 325. The additional STI structure(s) 109, 209, 309 can be shallower in depth than the STI structures 105, 205, 305. For example, the bottom of the additional STI structure(s) 109, 209, 309 can be above the level of the top surface of the insulator layer 102, 202, 302. Thus, the additional STI structure(s) 109, 209, 309 can be referred to, for example, as ultra-shallow shallow trench isolation (UTSI) structure(s).

The semiconductor controlled rectifier 110, 210, 310 can further include one or more on-well gates 130, 240, 330-340. For example, the semiconductor controlled rectifier 110 of the semiconductor structure 100 of FIGS. 1A-1B can include a gate 130 on the second surface 108 adjacent to the Nwell 121. The semiconductor controlled rectifier 210 of the semiconductor structure 200 of FIGS. 2A-2B can include a gate 240 on the second surface 208 adjacent to the Pwell 222. The semiconductor controlled rectifier 310 of the semiconductor structure 300 of FIGS. 3A-3B can include pair of gates including a first gate 330 on the second surface 308 adjacent to the Nwell 321 and a second gate 340 on the second surface 308 adjacent to the Pwell 321. In each semiconductor controlled rectifier 110, 210, 310, the gate(s) 130, 240, 330-340 can be completely offset by some distance from (i.e., physically separated from and not overlying) the PN junction 170, 270, 370 and can further be completely offset by some distance from (i.e., physically separated from and not overlying) any adjacent diffusion or contact regions. For example, the gate 130 of the semiconductor controlled rectifier 110 in FIGS. 1A-1B is completely offset from the PN junction 170, the P-type diffusion region 124, and the N-type contact region 123. The gate 240 of the semiconductor controlled rectifier 210 of FIGS. 2A-2B is completely offset from the PN junction 270, the N-type diffusion region 225, and the P-type contact region 226. Finally, in the semiconductor controlled rectifier 310 of FIGS. 3A-3B, the first gate 330 is completely offset from the PN junction 370, the P-type diffusion region 324, and the N-type contact region 323 and the second gate 340 is completely offset from the PN junction 370, the N-type diffusion region 325, and the P-type contact region 326.

It should be noted that each gate 130, 240, 330-340 can include an essentially rectangular-shaped gate stack with opposing sidewalls. The gate stack can include a gate dielectric layer 131, 241, 331-341 (including one or more layers of gate dielectric material) on the second surface 108, 208, 308 of the semiconductor layer 103, 203, 303 and a gate conductor layer 132, 242, 332-342 (including one or more layers of gate conductor materials) on the gate dielectric layer 131, 241, 331-341. The gate stack could be, for example, a gate-first polycrystalline semiconductor gate stack, a gate-first high-K metal gate (HKMG) stack, a replacement metal gate (RMG) stack or any other suitable type of gate stack. Those skilled in the art will recognize that a gate-first gate stack is a gate stack that is formed before source/drain formation, whereas a replacement gate stack is a gate stack that is formed following source/drain formation (e.g., by creating a gate opening by removing a sacrificial gate stack that was formed before source/drain formation and forming the replacement gate stack in the gate opening). In a gate-first polycrystalline semiconductor gate stack, the gate dielectric layer can be an oxide layer (e.g., an $SiO_2$ layer or other suitable gate oxide layer) and the gate conductor layer can be a doped polycrystalline semiconductor layer (e.g., a doped polysilicon layer or some other suitable doped polycrystalline semiconductor layer) on the gate dielectric layer. Optionally, a metal silicide layer (e.g., cobalt silicide (CoSi), nickel silicide (NiSi), tungsten silicide (WSi), titanium silicide (TiSi), or any other suitable metal silicide material layer) can be on the gate conductor layer. In a gate-first HKMG or RMG stack, the gate dielectric layer can include an interfacial layer (e.g., a silicon oxynitride (SiON) layer or other suitable interfacial layer) on the semiconductor layer and a high-K dielectric layer on the optional interfacial layer. Those skilled in the art will recognize that a high-K dielectric refers to a dielectric material with a dielectric constant (K) that is greater than 3.9. Such high-K dielectrics include, for example, hafnium (Hf)-based dielectrics, such as hafnium oxide, hafnium silicon oxide, hafnium silicon oxynitride, or hafnium aluminum oxide, as well as other high-k dielectrics, such as aluminum oxide, tantalum oxide, or zirconium oxide. The gate conductor layer can include one or more stacked metallic (e.g., a metal or metal alloy) layers. Various different gate-first and replacement gate stack structures and methods for forming such structures are well known in the art and, thus, the details thereof have been omitted from this specification in order to allow the reader to focus on the salient aspects of the disclosed embodiments.

Optionally, in the semiconductor controlled rectifier 110 of FIGS. 1A-1B and in the semiconductor controlled rectifier 310 of FIGS. 3A-3B, the gate 130, 330 on the Nwell 121, 321 can have a P-type work function (e.g., a work function between about 4.9 eV and about 5.2 eV and optimal for P-type field effect transistor (PFET) operation). Also, optionally, in the semiconductor controlled rectifier 210 of FIGS. 2A-2B and the semiconductor controlled rectifier 310 of FIGS. 3A-3B, the gate 240, 340 on the Pwell 222, 322 can have an N-type work function (e.g., a work function between about 3.9 eV and about 4.2 eV and optimal for N-type field effect transistor (NFET) operation). In a gate-first polycrystalline semiconductor gate stack, the desired effective work function can be achieved, for example, by doping the polycrystalline semiconductor with different dopants. For example, a P-type work function can be achieved by doping with a P-type dopant (e.g., boron (B) or indium (In) for polysilicon or any other polycrystalline silicon-based semiconductor); whereas an N-type work function can be achieved by doping with an N-type dopant (e.g., phosphorous (P), arsenic (As) or antimony (Sb) for polysilicon or any other polycrystalline silicon-based semiconductor). In a gate-first HKMG or RMG, the desired effective work function can be achieved, for example, using particular metal or metal alloy layers on the high-K gate dielectric layer. Exemplary metals (and metal alloys), which have a P-type work function include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Example metals (and metal alloys), which have an N-type work function include, but are not limited to, hafnium, zirconium, titanium, tantalum, aluminum, and alloys thereof, such as, hafnium carbide, zirconium carbide, titanium carbide, tantalum carbide, and aluminum carbide.

The semiconductor controlled rectifier 110, 210, 310 can further include gate sidewall spacers 135, 245, 335-345 positioned laterally adjacent to the opposing sidewalls of the gate stack of each gate 130, 240, 330-340. The gate sidewall spacers 135, 245, 335-345 can include one or more layers of spacer material. Those skilled in the art will recognize that such gate sidewall spacers are typically formed following gate stack formation by depositing one or more conformal layers of spacer material over the gate stack(s) and then perform at least one selective anisotropic etch process to remove the spacer material from horizontal surfaces, leaving it on vertical surfaces (i.e., on the gate sidewalls). The gate sidewall spacers can include silicon nitride (SiN), $SiO_2$, SiON, and/or any other suitable gate sidewall spacer material. Optionally, in the semiconductor controlled rectifier 110 of FIGS. 1A-1B and the semiconductor controlled rectifier 310 of FIGS. 3A-3B the gate sidewalls spacers 135, 335 on the gate 130, 330 can be entirely above the Nwell 121, 321 either spaced apart from or just extending laterally to the P-type diffusion region 124, 324 on one side and spaced apart from or just extending laterally to the junction 170, 370 on the opposite side. Optionally, in the semiconductor controlled rectifier 210 of FIGS. 2A-2B and the semiconductor rectifier 310 of FIGS. 3A-3B, the gate sidewalls spacers 245, 345 on the gate 240, 340 can be entirely above the Pwell 222, 322 either spaced apart from or just extending laterally to the N-type diffusion region 225, 325 on one side and spaced apart from or just extending laterally to the junction 170, 370 on the opposite side.

The semiconductor controlled rectifier 110, 210, 310 can further include a relatively thin dielectric layer and, particularly, a silicide blocking layer 161, 261, 361 on the second surface 108, 208, 308. This silicide blocking layer 161, 261, 361 can, for example, be a conformal layer of SiN or some other suitable dielectric material deposited (e.g., by atomic layer deposition (ALD)) onto the second surface 108, 208, 308. The silicide blocking layer can then be patterned (e.g., using conventional lithographic patterning and etch techniques) so that sections thereof remain above specific areas of the semiconductor layer. These specific areas can be selected to prevent silicide formation thereon during subsequent processing and, thereby to prevent shorting of the Nwell 121, 221, 321 and the Pwell 122, 222, 322 across the PN junction 170, 270, 370, to prevent shorting of the P-type diffusion region 124, 224, 324 and the Nwell 121, 221, 321 and to prevent shorting of the N-type diffusion region 125, 225, 325 and the Pwell 122, 222, 322 across the corresponding PN junction. For example, in the semiconductor controlled rectifier 110 of FIGS. 1A-1BA-1B, the silicide blocking layer 161 could have a first section, which extends laterally from a gate sidewall spacer 135 on one side of the gate 130 in a first direction over the adjacent surface of the Nwell 121, over the P-type diffusion region 124 and the N-type contact region 123. Silicide blocking layer 161 could have a second section, which extends laterally from the opposite gate sidewall spacer 135 in a second direction over the adjacent surface of the Nwell 121, over the PN junction 170, onto the Pwell 122, over the N-type diffusion region 125 and onto the P-type contact region 126. In the semiconductor controlled rectifier 210 of FIGS. 2A-2BA-2B, the silicide blocking layer 261 could have a first section, which extends laterally from a gate sidewall spacer 245 on one side of the gate 240 in a first direction over the adjacent surface of the Pwell 222, over the PN junction 270, onto the Nwell 221, over the P-type diffusion region 224 and further onto the N-type contact region 223., Silicide blocking layer 261 could have a second section, which extends laterally from the opposite gate sidewall spacer 245 in a second direction over the adjacent surface of the Pwell 222, over the N-type diffusion region 225 and onto the P-type contact region 226. In the semiconductor controlled rectifier 310 of FIGS. 3A-3BA-3B, the silicide blocking layer 361 could have a first section, which extends laterally from a gate sidewall spacer 335 on one side of the first gate 330 in a first direction over the adjacent surface of the Nwell 321, over the P-type diffusion region 324 and further onto the N-type contact region 323. Silicide blocking layer 361 could have a second section, which extends laterally from a gate sidewall spacer 345 on one side of the second gate 340 in a second direction over the adjacent surface of the Pwell 322, over the N-type diffusion region 325 and onto the P-type contact region 326, and a third section, which extends laterally between gates 330-340 over the PN junction 370. Although not shown, optionally, the silicide blocking layer 161, 261, 361 can be patterned so as to have openings aligned above the various diffusion and contact regions to allow metal silicide formation thereon without shorting to the adjacent well.

One or more layers 160, 260, 360 of middle of the line (MOL) dielectrics can cover the semiconductor controlled rectifier 110, 210, 310. These layer(s) 160, 260, 360 can include, but are not limited to, a relatively thin conformal dielectric layer (also referred to herein as an etch stop layer). This relatively thin conformal dielectric layer can be made of SiN or some other suitable etch stop material. These layer(s) can also a blanket layer of interlayer dielectric (ILD) material. This ILD material can be, for example, $SiO_2$, doped silicon glass (e.g., phosphosilicate glass (PSG) or borophosphosilicate glass (BPSG)), or any other suitable ILD material. MOL contacts can extend essentially vertically through the layer(s) 160, 260, 360 of MOL dielectric material to, for example, the gate(s) 130, 240, 330-340, to the P-type diffusion region 124, 224, 324, to the N-type contact region 123, 223, 323, to the N-type diffusion region 125, 225, 325, and to the P-type contact region 126, 226, 326 or metal silicide layers thereon.

In each of the above-described semiconductor structures 100 of FIGS. 1A-1B, 200 of FIGS. 2A-2B and 300 of FIGS. 3A-3B, the trigger voltage (Vtrig) of the semiconductor controlled rectifier 110, 210, 310 can be fine-tuned (i.e., adjusted) as a function of the gate leakage current through the gate(s) 130, 240, 330-340 and the gate leakage current can depend upon whether the particular gate 130, 240, 330 and/or 340 is left floating or electrically connected to some other component to enable specific biasing (i.e., to receive a gate bias voltage). As illustrated in FIGS. 1B, 2B, and 3B, optionally, the semiconductor controlled rectifier 110, 210, 310 can further include one or more additional STI structures 106, 206, 306 in the semiconductor layer 103, 203, 303 adjacent to one or both sides of any gate 130, 240, 330-340 without extending under the gate(s). The additional STI structure(s) 106, 206, 306, like the additional STI structure(s) 109, 209, 309 mentioned above, can be shallower in depth than the STI structures 105, 205, 305 (e.g., can be UTSI structure(s)) and can provide additional protection inadvertent formation of FET or GIDL device(s) so that the Vtrig remains a function of leakage current.

FIGS. 4.1-4.5 are diagrams illustrating electrical connections that can be employed (e.g., using a combination of both MOL contacts and back end of the line (BEOL) interconnects) to establish different biasing conditions in the semiconductor controlled rectifier 110 of the semiconductor structure 100 of FIG. 1A, as shown (or, alternatively, of FIG. 1B) to achieve different Vtrigs. As illustrated in FIG. 4.1, in some embodiments, the N-type contact region 123 and P-type diffusion region 124 can be electrically connected to an anode terminal 168, the N-type diffusion region 125 and the P-type contact region 126 can be electrically connected to a cathode terminal 169, and the gate 130 can be left floating (i.e., left unconnected so as not to receive a bias voltage). As illustrated in FIG. 4.2, in other embodiments, the N-type contact region 123, P-type diffusion region 124, and gate 130 can be electrically connected to an anode terminal 168 and the N-type diffusion region 125 and the P-type contact region 126 can be electrically connected to a cathode terminal 169. As illustrated in FIG. 4.3, in still other embodiments, the N-type contact region 123 and P-type diffusion region 124 can be electrically connected to an anode terminal 168, the N-type diffusion region 125 and the P-type contact region 126 can be electrically connected to a cathode terminal 169, and the gate 130 can be connected to ground 199. The configuration where the gate 130 is floating (FIG. 4.1) can be employed to reduce Vtrig as compared to a similar semiconductor controlled rectifier structure with no gate 130. Tying the gate 130 to the anode terminal 168 (FIG. 4.2) can be employed to reduce Vtrig as compared to the structure shown in FIG. 4.1. Tying the gate 130 to ground 199 (see FIG. 4.3) can be employed to further reduce Vtrig as compared to the structure shown in FIG. 4.2. In still other embodiments, the N-type contact region 123 and P-type diffusion region 124 can be electrically connected to an anode terminal 168, the N-type diffusion region 125 and the P-type contact region 126 can be electrically connected to a cathode terminal 169, and the gate 130 can be electrically connected to a switching circuit 180 (e.g., a multiplexor (MUX)) that enables the gate 130 to be selectively connected to any one of multiple voltage inputs (e.g., 181-183) for receiving different bias voltages and thereby providing greater Vtrig fine-tuning options (see FIG. 4.4). For example, a first voltage input 181 of the switching circuit 180 could be connected to the anode terminal 168, a second voltage input 182 could be connected to ground, a third voltage input 183 could be connected to a bias voltage generator (not shown) for receiving some different gate bias voltage, etc. As illustrated in FIG. 4.5, in yet another embodiment, the P-type diffusion region 124 and the gate 130 can be electrically connected to an anode terminal 168, the N-type diffusion region 125 can be electrically connected to a cathode terminal 169, and the contact regions 123 and 126 can be floating (i.e., left unconnected so as not to receive a bias voltage).

FIGS. 5.1-5.5 are diagrams illustrating electrical connections that can be employed (e.g., using a combination of both MOL contacts and BEOL interconnects) to establish different biasing conditions in the semiconductor controlled rectifier 210 of the semiconductor structure 200 of FIG. 2A, as shown (or, alternatively, of FIG. 2B) to achieve different Vtrigs. As illustrated in FIG. 5.1, in some embodiments, the N-type contact region 223 and P-type diffusion region 224 can be electrically connected to an anode terminal 168, the N-type diffusion region 225 and the P-type contact region 226 can be electrically connected to a cathode terminal 269, and the gate 240 can be left floating (i.e., left unconnected so as not to receive a bias voltage). As illustrated in FIG. 5.2, in other embodiments, the N-type contact region 223 and P-type diffusion region 224 can be electrically connected to an anode terminal 268 and the N-type diffusion region 225, the P-type contact region 226, and the gate 240 can be electrically connected to a cathode terminal 269. As illustrated in FIG. 5.3, in still other embodiments, the N-type contact region 223 and P-type diffusion region 224 can be electrically connected to an anode terminal 268, the N-type diffusion region 225 and the P-type contact region 226 can be electrically connected to a cathode terminal 269, and the gate 240 can be connected to ground 299. The configuration where the gate 240 is floating (FIG. 5.1) can be employed to reduce Vtrig as compared to a similar semiconductor controlled rectifier structure with no gate 240. Tying the gate 240 to the cathode terminal 269 (FIG. 5.2) can be employed to reduce Vtrig as compared to the structure shown in FIG. 5.1. Tying the gate 240 to ground 299 (see FIG. 5.3) can be employed to further adjust Vtrig. In still other embodiments, the N-type contact region 223 and P-type diffusion region 224 can be electrically connected to an anode terminal 268, the N-type diffusion region 225 and the P-type contact region 226 can be electrically connected to a cathode terminal 269, and the gate 240 can be electrically connected to a switching circuit 280 (e.g., a multiplexor (MUX)) that enables the gate 240 to be selectively connected to any one of multiple voltage inputs (e.g., 281-283) for receiving different bias voltages, thereby providing greater Vtrig fine-tuning options (see FIG. 5.4). For example, a first voltage input 281 of the switching circuit 280 could be connected to the cathode terminal 269, a second voltage input 282 could be connected to ground, a third voltage input 283 could be connected to a bias voltage generator (not shown) for receiving some different gate bias voltage, etc. As illustrated in FIG. 5.5, in yet another embodiment, the P-type diffusion region 224 can be electrically connected to an anode terminal 268, the N-type diffusion region 225 and gate 240 can be electrically connected to a cathode terminal 269, and the contact regions 223 and 226 can be floating (i.e., left unconnected so as not to receive a bias voltage).

FIGS. 6.1-6.4 are diagrams illustrating electrical connections that can be employed (e.g., using a combination of both MOL contacts and BEOL interconnects) to establish different biasing conditions in the semiconductor controlled rectifier 310 of the semiconductor structure 300 of FIG. 3A, as shown (or, alternatively, of FIG. 3B) to achieve different Vtrigs. As illustrated in FIG. 6.1, in some embodiments, the N-type contact region 323 and P-type diffusion region 324 can be electrically connected to an anode terminal 368, the N-type diffusion region 325 and the P-type contact region 326 can be electrically connected to a cathode terminal 369, and the gates 330-340 can be left floating (i.e., left unconnected so as not to receive a bias voltage). As illustrated in FIG. 6.2, in other embodiments, the N-type contact region 323, P-type diffusion region 324, and gate 330 can be electrically connected to an anode terminal 368 and the N-type diffusion region 325, the P-type contact region 326, and gate 340 can be electrically connected to a cathode terminal 369. As illustrated in FIG. 6.3, in still other embodiments, the N-type contact region 323 and P-type diffusion region 324 can be electrically connected to an anode terminal 368, the N-type diffusion region 325 and the P-type contact region 326 can be electrically connected to a cathode terminal 169, and the gates 330-340 can be connected to ground 399. The configuration where the gates 330-340 are floating (FIG. 6.1) can be employed to reduce Vtrig as compared to a similar semiconductor controlled rectifier structure with no gates. Tying the gate 330 to the anode terminal 368 and the gate 340 to the cathode terminal 369 (FIG. 6.2) can be employed to reduce Vtrig as compared to a structure with no gates or as compared to the structure shown in FIG. 6.1 (e.g., by 0.1-5.0V, such as by 3.0V). Tying the gates 330-340 to ground 399 (see FIG. 6.3) can be employed to further reduce Vtrig as compared to the structure shown in FIG. 6.2 (e.g., by an additional 5.0-10.0V, such as by 7.0V). In still other embodiments, the N-type contact region 323 and P-type diffusion region 324 can be electrically connected to an anode terminal 368, the N-type diffusion region 325 and the P-type contact region 326 can be electrically connected to a cathode terminal 369, and the gates 330-340 can be electrically connected to a switching circuit 380 that enables the gates 330-340 to be selectively connected to the same or different voltage inputs (e.g., 381-384) for receiving the same or different bias voltages or to be left floating, thereby providing greater Vtrig fine-tuning options (see FIG. 6.4). For example, a first voltage input 381 of the switching circuit 380 could be connected to the anode terminal 368, a second voltage input 382 could be connected to ground, a third voltage input 383 could be connected to the cathode terminal 369, a fourth voltage input 384 could be a bias voltage generator (not shown) for receiving some different gate bias voltage, etc.

Figure 7A:
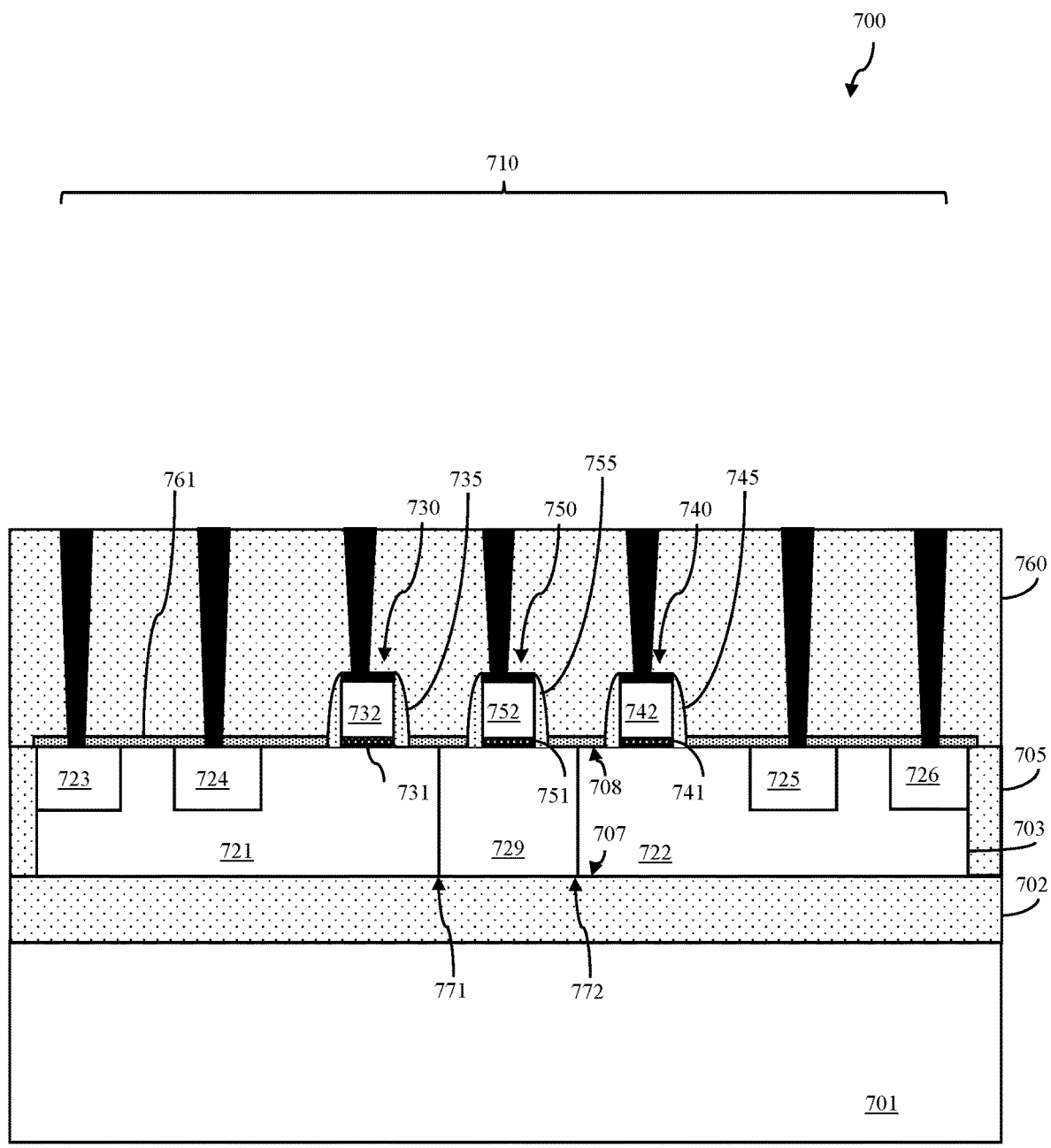
FIGS. 7A-7B are cross-section diagrams illustrating alternative configurations for an embodiment of semiconductor structure.
Figure 7B:
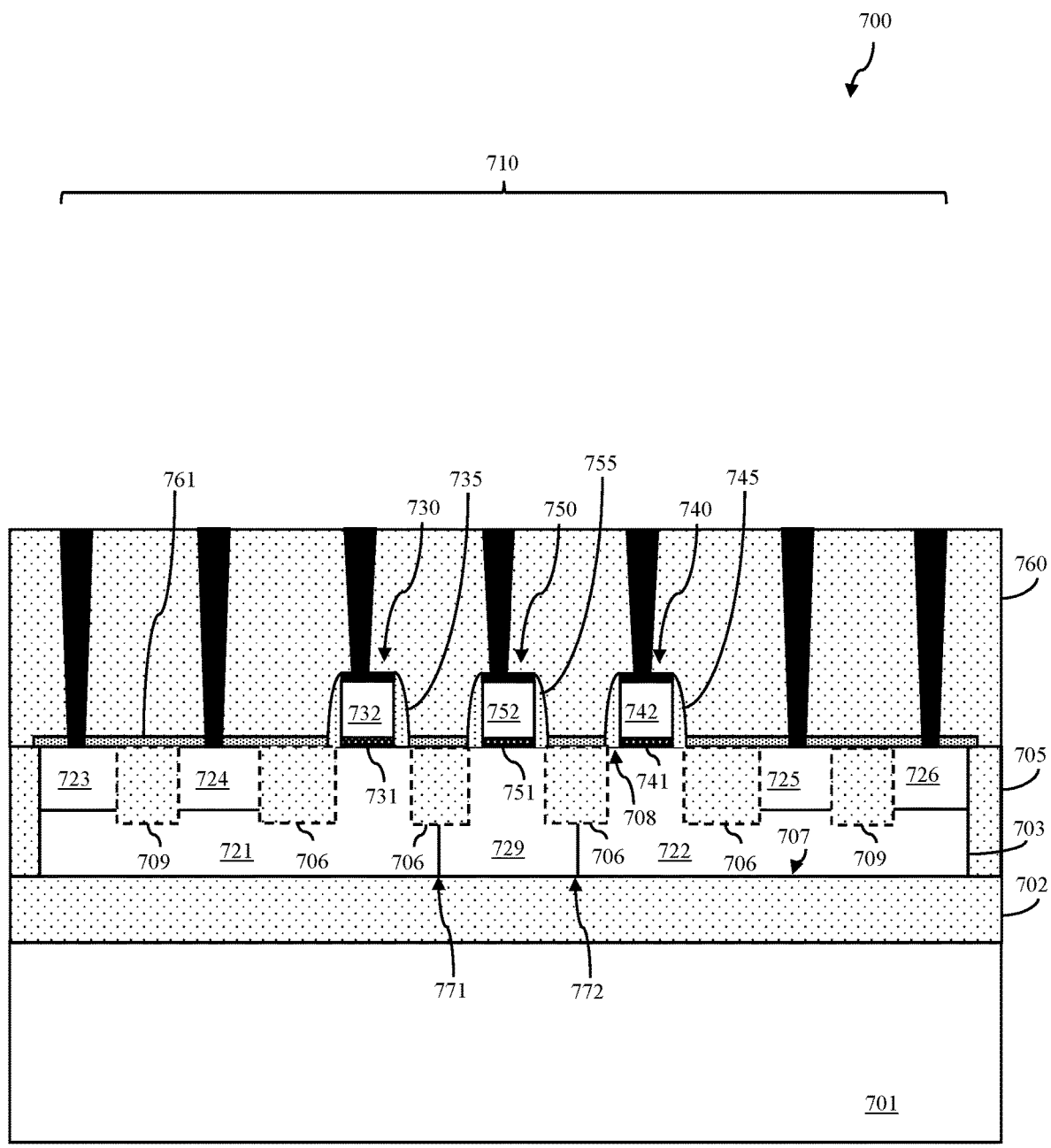

FIGS. 7A and 7B are cross-section diagrams illustrating alternative configurations of yet another embodiment of a semiconductor structure 700 that includes a semiconductor controlled rectifier 710 and, more particularly, a bidirectional semiconductor controlled rectifier (e.g., a BDSCR) (also referred to in the art as a dual-direction semiconductor controlled rectifier) with multiple on-well gates that enable fine-tuning of the voltage trigger (Vtrig) using gate leakage current.

The semiconductor structure 700 can include a semiconductor layer 703. As with the previously described semiconductor structure embodiments, the semiconductor layer 703 could be either a semiconductor layer of a semiconductor-on-insulator structure (e.g., on an insulator layer 702 above a semiconductor substrate 701) or a bulk semiconductor substrate. In any case, the semiconductor layer 703 can have a first surface 707 (e.g., a bottom surface) and a second surface 708 (e.g., a top surface) opposite the first surface.

The semiconductor structure 700 can further include a bidirectional semiconductor controlled rectifier 710 (e.g., a BDSCR) including a first semiconductor controlled rectifier and a second semiconductor controlled rectifier. Those skilled in the art will recognize that a bidirectional semiconductor controlled rectifier is a device that includes two unidirectional solid-state current-controlling devices with p-n-p-n layers oriented in opposite directions and overlapping.

Specifically, the bidirectional semiconductor controlled rectifier 710 can include an active device region in the semiconductor layer 703. The boundaries of the active device region can, for example, be defined by STI structures 705. That is, STI structures 105 can laterally surround to a portion of the semiconductor layer referred to herein as the active device region. The STI structures 705 can, for example, extend vertically from the top surface of the semiconductor layer to the insulator layer. The bidirectional semiconductor controlled rectifier 710 can include, within the active device region of the semiconductor layer, a first well 721, a second well 722, and a third well 729 positioned laterally between and immediately adjacent to the first well 721 and the second well 722. The first well 721 and second well 722 can have the same type conductivity. The third well 729 can have a different type conductivity than the first well 721 and the second well 722. Thus, there is a first PN junction 771 between the first well 721 and the third well 729 and a second PN junction between the second well 722 and the third well 729. In some embodiments, the first well 721 and the second well 722 can be Nwells and the third well 729 can be a Pwell. Alternatively, the first well 721 and the second well 722 could be Pwells and the third well 729 could be an Nwell.

The bidirectional semiconductor controlled rectifier 710 can further include a first P-type diffusion region 724 and a first N-type diffusion region 723 in the first well 721 at the second surface 708 physically separated from each other and from the first PN junction 771. The bidirectional semiconductor controlled rectifier 710 can further include second P-type diffusion region 726 and a second N-type diffusion region 725 in the second well 722 at the second surface 708 physically separated from each other and from the second PN junction 772. Such diffusion regions can be doped so as to have a higher conductivity level than wells of the same conductivity type. For example, the first N-type diffusion region 723 and second N-type diffusion region 725 can have N+ conductivity (i.e., can be N+ diffusion regions) and the first P-type diffusion region 724 and second P-type diffusion region 726 can have P+ conductivity (i.e., can be P+ diffusion regions). As illustrated in FIG. 7B, optionally, additional STI structures 709 can be in the first well 721, positioned laterally between the first P-type diffusion region 724 and the first N-type diffusion region 723 and/or in the second well 722 positioned laterally between the second P-type diffusion region 726 and the second N-type diffusion region 725. The additional STI structure(s) 709 can be shallower in depth than the STI structures 705 (e.g., can be UTSI structure(s)).

In embodiments where the first well 721 and second well 722 are Nwells and the third well is a Pwell, the p-n-p-n layers of the first semiconductor controlled rectifier can be the first P-type diffusion region 724, the first well 721 (e.g., an Nwell), the third well 729 (e.g., a Pwell), and the second well 722 (e.g., an Nwell) including the second N-type diffusion region 725 that functions as the contact region for the second well 722. Furthermore, the p-n-p-n layers of the second semiconductor controlled rectifier can include the second P-type diffusion region 725, the second well 722 (e.g., an Nwell), the third well 729 (e.g., a Pwell), and the first well 721 (e.g., an Nwell) including the first N-type diffusion region 723 that functions as the contact region for the first well 721.

In embodiments where the first well 721 and second well 722 are Pwells and the third well is an Nwell, the p-n-p-n layers of the first semiconductor controlled rectifier can be the first well 721 (e.g., a Pwell) including the first P-type diffusion region 724 that functions as the contact region for the first well 721, the third well 729 (e.g., an Nwell), the second well 722 (e.g., a Pwell) and the second N-type diffusion region 725. Furthermore, the p-n-p-n layers of the second semiconductor controlled rectifier can include the second well 722 (e.g., a Pwell) including the second P-type diffusion region 725 that functions as a contact region for the second well 722, the third well 729 (e.g., an Nwell), the first well 721 (e.g., a Pwell) and the first N-type diffusion region 723.

In any case, the bidirectional semiconductor controlled rectifier 710 can further include one or more on-well gates 730, 740, 750. For purposes of illustration all three on-well gates are illustrated in FIGS. 1A-1B and described below. However, it should be understood optionally the bidirectional semiconductor controlled rectifier 710 could include any combination of the on-well gates 730, 740 and/or 750. More particularly, the bidirectional semiconductor controlled rectifier 710 of the semiconductor structure 710 can include a first gate 730 on the second surface 708 adjacent to the first well 721, a second gate 740 on the second surface 708 adjacent to the second well 722, and/or a third gate 750 on the second surface 708 adjacent to the third well 729. The gate(s) 730, 740, 750 can be completely offset by some distance from (i.e., physically separated from and not overlying) any PN junction. That is, the first gate 730 and the third gate 750 can be completely offset from the first PN junction 771 and the second gate 740 and the third gate 750 can be completely offset from the second PN junction 772. Additionally, the first gate 730 can be completely offset by some distance from (i.e., physically separated from and not overlying) the first P-type and N-type diffusion regions in the first well 721. Similarly, the second gate 740 can be completely offset by some distance from (i.e., physically separated from and not overlying) the second P-type and N-type diffusion regions in the first well 722.

Each gate 730, 740 and 750 can include an essentially rectangular-shaped gate stack with opposing sidewalls. The gate stack can include a gate dielectric layer 731, 741, 751 (including one or more layers of gate dielectric material) on the second surface 708 of the semiconductor layer 703 and a gate conductor layer 732, 742, 752 (including one or more layers of gate conductor materials) on the gate dielectric layer. The gate stack could be, for example, a gate-first polycrystalline semiconductor gate stack, a gate-first high-K metal gate (HKMG) stack, a replacement metal gate (RMG) stack or any other suitable type of gate stack. As discussed in detail above with regard to the semiconductor structures 100, 200, and 300, various different gate-first and replacement gate stack structures and methods for forming such structures are well known in the art and, thus, the details thereof have been omitted from this specification in order to allow the reader to focus on the salient aspects of the disclosed embodiments.

The bidirectional semiconductor controlled rectifier 710 can further include gate sidewall spacers 735, 745, 755 positioned laterally adjacent to the opposing sidewalls of the gate stack of each gate 730, 740, 750. The gate sidewall spacers 735, 745, 755 can include one or more layers of spacer material. As discussed in detail above with regard to the semiconductor structures 100, 200, 300, such gate sidewall spacers are typically formed following gate stack formation by depositing one or more conformal layers of spacer material over the gate stack(s) and then perform at least one selective anisotropic etch process to remove the spacer material from horizontal surfaces, leaving it on vertical surfaces (i.e., on the gate sidewalls). Optionally, in the bidirectional semiconductor controlled rectifier 710, the gate sidewall spacers 735 can be on the first gate 730 entirely above the first well 721 either spaced apart from or just extending laterally to the first P-type diffusion region 724 on one side and spaced apart from or just extending laterally to the first PN junction 771 on the opposite side. The gate sidewall spacers 745 can be on the second gate 740 entirely above the second well 722 either spaced apart from or just extending laterally to the second N-type diffusion region 725 on one side and spaced apart from or just extending laterally to the second PN junction 772 on the opposite side. The gate sidewall spacers 755 can be on the third gate 750 entirely above the third well 729 either spaced apart from or just extending laterally to the first PN junction 771 on one side and the second PN junction 772 on the opposite side. The bidirectional semiconductor controlled rectifier 710 can further include a silicide blocking layer 761 on the second surface 708. This silicide blocking layer 761 can, for example, be a conformal layer of SiN or some other suitable dielectric material deposited (e.g., by ALD) onto the second surface 708. The silicide blocking layer 761 can be patterned (e.g., using conventional lithographic patterning and etch techniques) so that sections thereof remain on specific areas of the semiconductor layer. The specific areas can be selected to prevent silicide formation thereon during subsequent processing and, thereby to prevent shorting across the various PN junctions formed between the wells and the diffusion regions therein. Thus, for example, in the bidirectional semiconductor controlled rectifier 710, the silicide blocking layer 161 could have sections that extend laterally between the gates, that extend laterally from a gate sidewall spacer 735 on one side of the first gate 730, over the first well 721 and first P-type and N-type diffusion regions, and that extend laterally from a gate sidewall spacer 745 on one side of the second gate 740 over the second well 722 and the second P-type and N-type diffusion regions. Although not shown, optionally, the silicide blocking layer 761 can be patterned so as to have openings aligned above the various diffusion regions to allow metal silicide formation thereon without shorting to the adjacent well.

One or more layers 760 of MOL dielectrics can cover the bidirectional semiconductor controlled rectifier 710. These layer(s) 760 can include, but are not limited to, a relatively thin conformal dielectric layer (also referred to herein as an etch stop layer) and a blanket layer of interlayer dielectric (ILD) material, as discussed in greater detail above with regard to the semiconductor structures 100, 200, 300. MOL contacts can extend essentially vertically through the layer(s) 760 of MOL dielectric material to, for example, the gate(s) 730, 740, and 750, to the first P-type diffusion region 724 and first N-type diffusion region 723, and to the second P-type diffusion region 726 and second N-type diffusion region 725 or metal silicide layers thereon.

In the semiconductor structure 700, the Vtrigs of the first and second semiconductor controlled rectifiers of the bidirectional semiconductor controlled rectifier 710 can be fine-tuned (i.e., adjusted) as a function of the gate leakage current through the gate(s) 730, 740 and/or 750 and the gate leakage current(s) can depend upon whether each particular gate 730, 740, and/or 750 is left floating or electrically connected to some other component to enable gate biasing (i.e., to receive a gate bias voltage). As illustrated in FIG. 7B, optionally, the semiconductor controlled rectifier 710 can further include one or more additional STI structures 706 in the semiconductor layer 703 adjacent to one or both sides of one or more of the gates 730, 740, 750 without extending under the gate(s). The additional STI structure(s) 706, like the additional STI structure(s) 709 mentioned above, can be shallower in depth than the STI structures 705 (e.g., can be UTSI structure(s)) and can provide additional protection inadvertent formation of FET or GIDL device(s) so that the Vtrig remains a function of leakage current.

FIGS. 8.1-8.4 are diagrams illustrating electrical connections that can be employed (e.g., using a combination of both MOL contacts and BEOL interconnects) to establish different biasing conditions in the bidirectional semiconductor controlled rectifier 710 to achieve different Vtrigs. As illustrated in FIG. 8.1, in some embodiments, the first P-type diffusion region 724 and first N-type diffusion region 723 can be electrically connected to a first terminal 768, the second P-type diffusion region 726 and second N-type diffusion region 725 can be electrically connected to a second terminal 769, and the gate(s) 730, 740, 750 can be left floating (i.e., left unconnected so as not to receive a bias voltage). As illustrated in FIG. 8.2, in other embodiments, the first P-type diffusion region 724 and first N-type diffusion region 723, the first gate 730 and the third gate 750 can be electrically connected to a first terminal 768 and the second P-type diffusion region 726 and second N-type diffusion region 725 and the second gate 740 can be electrically connected to a second terminal 769. As illustrated in FIG. 8.3, in still other embodiments, the first P-type diffusion region 724 and first N-type diffusion region 723 can be electrically connected to a first terminal 768, the second P-type diffusion region 726 and second N-type diffusion region 725 can be electrically connected to a second terminal 769, and the gate(s) 730, 740, 750 can be connected to ground 799. As illustrated in FIG. 8.4, in still other embodiments, the first P-type diffusion region 724 and first N-type diffusion region 723 can be electrically connected to a first terminal 768, the second P-type diffusion region 726 and second N-type diffusion region 725 can be electrically connected to a second terminal 769, and the gate(s) 730, 740, 750 can be electrically connected to a switching circuit 780 that enables the gates to be selectively connected to the same or different voltage inputs (e.g., 781-784) for receiving the same or different bias voltages or to be left floating. For example, a first voltage input 781 of the switching circuit 780 could be connected to the first terminal 768, a second voltage input 782 could be connected to ground, a third voltage input 783 could be connected to the second terminal 769, a fourth voltage input 784 could be a bias voltage generator (not shown) for receiving some different gate bias voltage, etc.

The above-described semiconductor structures can be formed using conventional processing techniques for forming wells, STI and USTI structures, gate(s), gate sidewall spacers, diffusion regions, silicide blocking layers, MOL dielectric layers, MOL contacts, and any of the other individual components of the above-described semiconductor structures 100-300 and 700. However, it should be understood that these processing techniques will be performed in a manner that achieves the unique placement of the individual components (including, but not limited to, the unique placement of the gate(s) relative to the well(s), to the junctions between adjacent wells, and to diffusion regions therein and the unique placement of the optional USTI structure(s) relative to the sides of the gate(s), to the diffusion region(s), and the wells) within the semiconductor controlled rectifier 110 of FIGS. 1A-1B, the semiconductor controlled rectifier 210 of FIGS. 2A-2B, the semiconductor controlled rectifier 310 of FIGS. 3A-3B, and the bidirectional semiconductor controlled rectifier 710 of FIGS. 7A-7B, as discussed in detail above.

For example, to form the disclosed semiconductor structure embodiments, STI structures can be formed (e.g., by conventional trench formation and fill techniques) to define an active device region for a semiconductor controlled rectifier within a semiconductor layer. Wells can be formed in the active device region of the semiconductor layer (e.g., by conventional masked dopant implantation processes). Optionally, one or more USTI structures can be formed (e.g., by conventional trench formation and fill techniques) at designated location(s) within the active device region so that in the final semiconductor structure each optional USTI structure will be either between diffusion regions within a well or adjacent to one side of a gate. Gate(s) can be formed (e.g., by depositing gate dielectric and gate conductor layers and then lithographically patterning and etching the layers to form a gate stack) such that each gate is on well at a designated location, which is offset from any junctions between adjacent wells, and which in the final structure will be offset from any diffusion regions within the well. Gate sidewall spacers can be formed on each gate (e.g., using conventional gate sidewall spacer formation techniques). Diffusion region(s) can be formed in each well (e.g., by masked dopant implantation processes or by trench formation and epitaxial semiconductor layer deposition processes). Additional processing can include, but is not limited to, deposition and patterning of a silicide blocking layer to cover exposed surfaces of the semiconductor layer, deposition of one or more MOL dielectric layers, formation of MOL contacts, formation of BEOL interconnects, etc. As a result, the disclosed method embodiments can be used to form a semiconductor structure 100, 200, 300, 700 including a semiconductor controlled rectifier 110, 210, 310, 710 with one or more gates, where no gate overlaps a pair of diffusion regions on either side so as to function as a control terminal of an on/off field effect transistor (FET)-type switch for tuning Vtrig and where no gate overlaps only a single diffusion region on one side so as to facilitate gate induced drain leakage (GIDL) for tuning Vtrig. Instead, each gate on a well within each semiconductor controlled rectifier 110, 210, 310, 710 is completely offset from all diffusion regions within the well and from all junctions between adjacent wells and, optionally, each gate isolated from an adjacent diffusion region and/or a junction between adjacent wells by USTI structure(s). Thus, in the resulting structure, only gate leakage current resulting from floating or biasing each gate is employed to fine-tune V-trig (e.g., by amounts ranging from, for example, 0.1V to 10.0V).

It should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor layer having a first surface and a second surface opposite the first surface;
   an Nwell in the semiconductor layer;
   a Pwell in the semiconductor layer positioned laterally immediately adjacent to the Nwell;
   a P-type diffusion region in the Nwell at the second surface and physically separated from a junction between the Nwell and the Pwell;
   an N-type diffusion region in the Pwell at the second surface and physically separated from the junction; and
   a gate on the second surface between the P-type diffusion region and the N-type diffusion region, wherein the gate is offset from the junction, above only one of the Nwell and the Pwell, and physically separated from the P-type diffusion region and from the N-type diffusion region, and wherein a portion of the one of the Nwell and the Pwell below the gate and extending laterally to the junction is devoid of any additional diffusion regions.

2. The structure of claim 1, wherein the gate is immediately adjacent to the Nwell.

3. The structure of claim 2, wherein the P-type diffusion region is electrically connected to an anode terminal and wherein the gate is any of:
   floating;
   electrically connected to the anode terminal;
   electrically connected to ground; and
   electrically connected to an output of a switching circuit, wherein the switching circuit connects the gate to one of multiple different gate voltage inputs.

4. The structure of claim 2, wherein the gate includes:
   a gate dielectric layer adjacent to the second surface; and
   a gate conductor layer on the gate dielectric layer, wherein the gate conductor layer includes any of a P-type polycrystalline semiconductor layer and a metallic layer.

5. The structure of claim 1, wherein the gate is immediately adjacent to the Pwell.

6. The structure of claim 5, wherein the N-type diffusion region is electrically connected to a cathode terminal and wherein the gate is any of:
   floating;
   electrically connected to the cathode terminal;

electrically connected to ground; and
electrically connected to an output of a switching circuit, wherein the switching circuit connects the gate to one of multiple different voltage inputs.

7. The structure of claim 5, wherein the gate includes:
a gate dielectric layer adjacent to the second surface; and
a gate conductor layer on the gate dielectric layer, wherein the gate conductor layer includes any of an N-type polycrystalline semiconductor layer and a metallic layer.

8. The structure of claim 1, further comprising sections of a dielectric layer on the second surface above the junction between the Nwell and the Pwell and further above junctions between the P-type diffusion region and the Nwell and between the N-type diffusion region and the Pwell.

9. The structure of claim 1, further comprising at least one isolation structure in the semiconductor layer adjacent to at least one side of the gate.

10. A structure comprising:
a semiconductor layer having a first surface and a second surface opposite the first surface;
an Nwell in the semiconductor layer;
a Pwell in the semiconductor layer positioned laterally immediately adjacent to the Nwell;
a P-type diffusion region in the Nwell at the second surface and physically separated from a junction between the Nwell and the Pwell;
an N-type diffusion region in the Pwell at the second surface and physically separated from the junction;
a first gate on the second surface immediately adjacent to the Nwell and physically separated from the P-type diffusion region and from the junction; and
a second gate on the second surface immediately adjacent to the Pwell and physically separated from the N-type diffusion region and from the junction, wherein a portion of the Nwell below the first gate and extending laterally to the junction and a portion of the Pwell below the second gate and extending laterally to the junction are devoid of any additional diffusion regions.

11. The structure of claim 10, wherein the P-type diffusion region is electrically connected to an anode terminal and wherein the first gate is any of:
floating;
electrically connected to the anode terminal;
electrically connected to ground; and
electrically connected to an output of a switching circuit, wherein the switching circuit connects the first gate to one of multiple different voltage inputs.

12. The structure of claim 10, wherein the first gate includes:
a gate dielectric layer adjacent to the second surface; and
a gate conductor layer on the gate dielectric layer, wherein the gate conductor layer includes any of a P-type polycrystalline semiconductor layer and a metallic layer.

13. The structure of claim 10, wherein the N-type diffusion region is electrically connected to a cathode terminal and wherein the second gate is any of:
floating;
electrically connected to the cathode terminal;
electrically connected to ground; and
electrically connected to an output of a switching circuit, wherein the switching circuit connects the second gate to one of multiple different gate voltage inputs.

14. The structure of claim 10, wherein the second gate includes:
a gate dielectric layer adjacent to the second surface; and
a gate conductor layer on the gate dielectric layer, wherein the gate conductor layer includes any of an N-type polycrystalline semiconductor layer and a metallic layer.

15. The structure of claim 10, further comprising sections of a dielectric layer on the second surface above the junction between the Nwell and the Pwell and further above junctions between the P-type diffusion region and the Nwell and between the N-type diffusion region and the Pwell.

16. The structure of claim 10, further comprising at least one isolation structure in the semiconductor layer adjacent to at least one side of at least one of the first gate and the second gate.

17. A structure comprising:
a semiconductor layer having a first surface and a second surface opposite the first surface;
a first well in the semiconductor layer;
a second well in the semiconductor layer;
a third well in the semiconductor layer positioned laterally between and immediately adjacent to the first well and the second well, wherein the third well has a different type conductivity than the first well and the second well;
first P-type and N-type diffusion regions in the first well at the second surface and physically separated from a first junction between the first well and the third well;
second P-type and N-type diffusion regions in the second well at the second surface and physically separated from a second junction between the second well and the third well;
a first gate on the second surface immediately adjacent to the first well and physically separated from the first P-type and N-type diffusion regions and from the first junction;
a second gate on the second surface immediately adjacent to the second well and physically separated from the second P-type and N-type diffusion regions and from the second junction; and
a third gate on the second surface immediately adjacent to the third well and physically separated from the first junction and from the second junction.

18. The structure of claim 17,
wherein the first P-type and N-type diffusion regions are electrically connected to a first terminal, and
wherein the second P-type and N-type diffusion regions are electrically connected to a second terminal.

19. The structure of claim 17, wherein the first gate, the second gate, and the third gate are one of floating, electrically connected to ground, and electrically connected to a switching circuit.

20. The structure of claim 17, wherein the first gate and the third gate are electrically connected to the first terminal and the second gate is electrically connected to the second terminal.

* * * * *